(12) United States Patent
Lin et al.

(10) Patent No.: US 12,159,791 B2
(45) Date of Patent: Dec. 3, 2024

(54) INFO PACKAGES INCLUDING THERMAL DISSIPATION BLOCKS

(71) Applicant: Taiwan Semiconductor Manufacturing Co., Ltd., Hsinchu (TW)

(72) Inventors: Ching-Yi Lin, Zhubei (TW); Yu-Hao Chen, Hsinchu (TW); Fong-Yuan Chang, Hsinchu (TW); Po-Hsiang Huang, Tainan (TW); Jyh Chwen Frank Lee, Palo Alto, CA (US); Shuo-Mao Chen, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/357,520

(22) Filed: Jul. 24, 2023

(65) Prior Publication Data

US 2024/0021441 A1    Jan. 18, 2024

Related U.S. Application Data

(63) Continuation of application No. 17/371,673, filed on Jul. 9, 2021, now Pat. No. 11,817,324.

(Continued)

(51) Int. Cl.
*H01L 21/48* (2006.01)
*H01L 23/00* (2006.01)
(Continued)

(52) U.S. Cl.
CPC ...... *H01L 21/4882* (2013.01); *H01L 21/4857* (2013.01); *H01L 21/486* (2013.01);
(Continued)

(58) Field of Classification Search
CPC ............. H01L 21/4882; H01L 21/4857; H01L 21/486; H01L 23/367; H01L 23/49816;
(Continued)

(56) References Cited

U.S. PATENT DOCUMENTS

| 11,133,282 | B2 | 9/2021 | Yu et al. | |
| 2020/0058632 | A1* | 2/2020 | Chen | ........................ H01L 24/33 |
| 2021/0118765 | A1 | 4/2021 | Kang et al. | |

FOREIGN PATENT DOCUMENTS

| DE | 102019117892 A1 | 12/2020 |
| DE | 102017123326 B4 | 4/2021 |

(Continued)

*Primary Examiner* — Jasmine J Clark
(74) *Attorney, Agent, or Firm* — Slater Matsil, LLP

(57) ABSTRACT

A method includes forming a package, which includes forming a plurality of redistribution lines over a carrier, and forming a thermal dissipation block over the carrier. The plurality of redistribution lines and the thermal dissipation block are formed by common processes. The thermal dissipation block has a first metal density, and the plurality of redistribution lines have a second metal density smaller than the first metal density. The method further includes forming a metal post over the carrier, placing a device die directly over the thermal dissipation block, and encapsulating the device die and the metal post in an encapsulant. The package is then de-bonded from the carrier.

20 Claims, 30 Drawing Sheets

Related U.S. Application Data

(60) Provisional application No. 63/188,212, filed on May 13, 2021.

(51) Int. Cl.
  *H01L 23/367* (2006.01)
  *H01L 23/498* (2006.01)

(52) U.S. Cl.
  CPC ...... *H01L 23/367* (2013.01); *H01L 23/49816* (2013.01); *H01L 23/49822* (2013.01); *H01L 23/49838* (2013.01); *H01L 24/16* (2013.01); *H01L 24/19* (2013.01); *H01L 24/24* (2013.01); *H01L 24/32* (2013.01); *H01L 24/73* (2013.01); *H01L 24/83* (2013.01); *H01L 2224/16227* (2013.01); *H01L 2224/24226* (2013.01); *H01L 2224/32225* (2013.01); *H01L 2224/73209* (2013.01); *H01L 2224/73253* (2013.01); *H01L 2224/73267* (2013.01)

(58) Field of Classification Search
  CPC ......... H01L 23/49822; H01L 23/49838; H01L 24/16; H01L 24/19; H01L 24/24; H01L 24/32; H01L 24/73; H01L 24/83; H01L 2224/16227; H01L 2224/24226; H01L 2224/92225; H01L 2224/73209; H01L 2224/73253; H01L 2224/73267
  USPC ........................................................ 257/712
  See application file for complete search history.

(56) References Cited

FOREIGN PATENT DOCUMENTS

| TW | 202032679 A | 9/2020 |
|---|---|---|
| TW | 202117949 A | 5/2021 |

\* cited by examiner

INFO PACKAGES INCLUDING THERMAL DISSIPATION BLOCKS

PRIORITY CLAIM AND CROSS-REFERENCE

This application is a continuation of U.S. patent application Ser. No. 17/371,673, filed Jul. 9, 2021 and entitled "Info Packages Including Thermal Dissipation Blocks," now U.S. Pat. No. 11,817,124, which claims the benefit of the U.S. Provisional Application No. 63/188,212, filed on May 13, 2021, and entitled "An InFO Package Structure for Effective Thermal Dissipation," which applications are hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

In some packaging processes, device dies are sawed from wafers before they are packaged, wherein redistribution lines are formed to connect to the device dies. An advantageous feature of this packaging technology is the possibility of forming fan-out packages, which means the I/O pads on a die can be redistributed to a greater area than the die, and hence the number of I/O pads on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
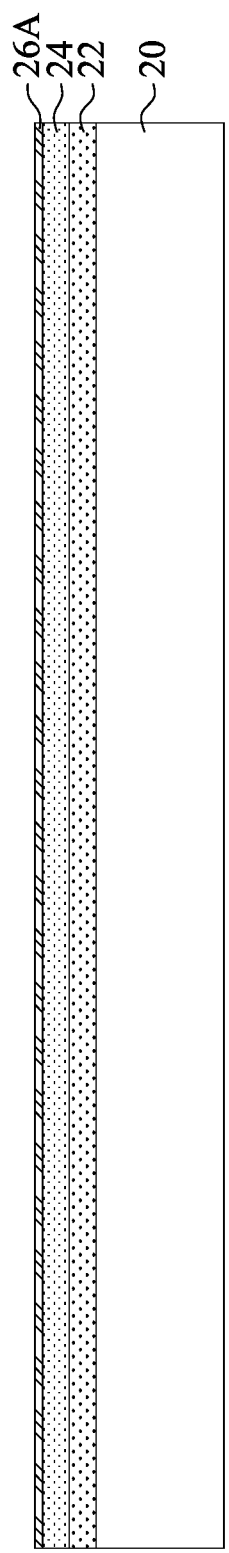
FIGS. 1-17 illustrate the cross-sectional views of intermediate stages in the formation of a package including thermal dissipation blocks in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including a thermal dissipation block and the method of forming the same are provided. In accordance with some embodiments of the present disclosure, the thermal dissipation block is close to a heat-generating die. The thermal dissipation block may include a higher metal density than the regions including redistribution lines. The thermal dissipation block may include portions distributed in a plurality of metal layers, and the portions may be physically interconnected through vias for good thermal dissipation ability. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 30:
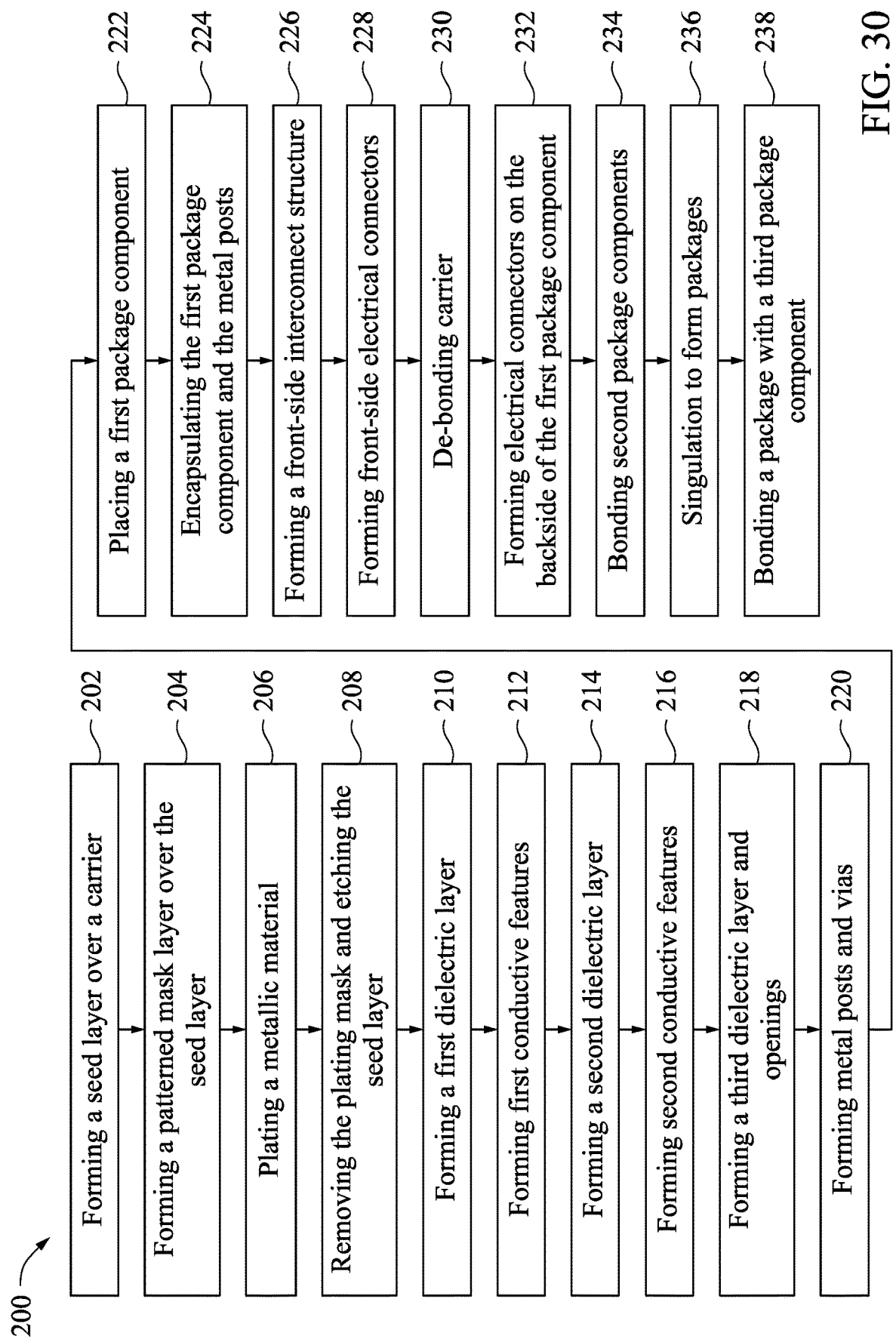
FIG. 30 illustrates a process flow for forming a package including a thermal dissipation block in accordance with some embodiments.

FIGS. 1 through 17 illustrate the cross-sectional views of intermediate stages in the formation of package including a thermal dissipation block and redistribution lines in accordance with some embodiments of the present disclosure. The corresponding processes are also reflected schematically in the process flow shown in FIG. 30.

Referring to FIG. 1, carrier 20 is provided, and release film 22 is coated on carrier 20. Carrier 20 is formed of a transparent material, and may be a glass carrier, a ceramic carrier, or the like. Release film 22 may be formed of a Light-To-Heat-Conversion (LTHC) coating material. Release film 22 may be applied onto carrier 20 through coating. In accordance with some embodiments of the present disclosure, the LTHC coating material is capable of being decomposed under the heat of light/radiation (such as laser), and hence can release carrier 20 from the structure formed thereon.

In accordance with some embodiments, as shown in FIG. 1, dielectric layer 24 is formed on release film 22. Dielectric layer 24 may be formed of or comprise a polymer such as polybenzoxazole (PBO), polyimide, benzocyclobutene (BCB), or the like.

Figure 2:
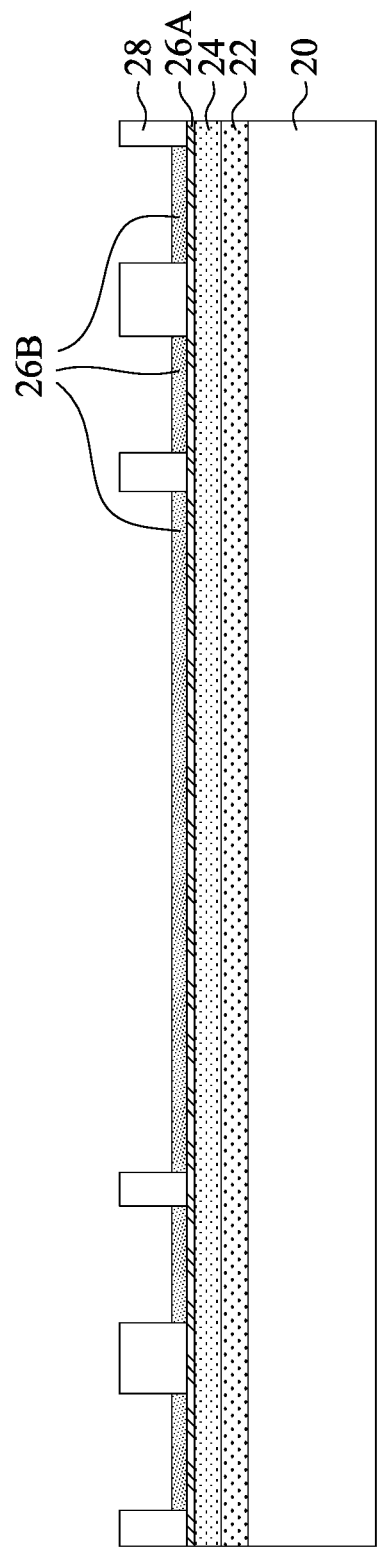

Metal seed layer 26A is deposited over dielectric layer 24. The respective process is illustrated as process 202 in the process flow 200 shown in FIG. 30. In accordance with some embodiments of the present disclosure, metal seed layer 26A includes a titanium layer and a copper layer over the titanium layer. The metal seed layer may be formed through, for example, using Physical Vapor Deposition (PVD), Chemical Vapor Deposition (CVD), or the like. Next, as shown in FIG. 2, a patterned plating mask 28 is applied and patterned. The respective process is illustrated as process 204 in the process flow 200 shown in FIG. 30. In accordance with some embodiments, the patterned plating mask 28 comprises a patterned photo resist. In accordance with alternative embodiments, plating mask 28 comprises a dry film, which is laminated and then patterned. Some portions of metal seed layer 26A are exposed through the patterned plating mask 28.

Figure 3:
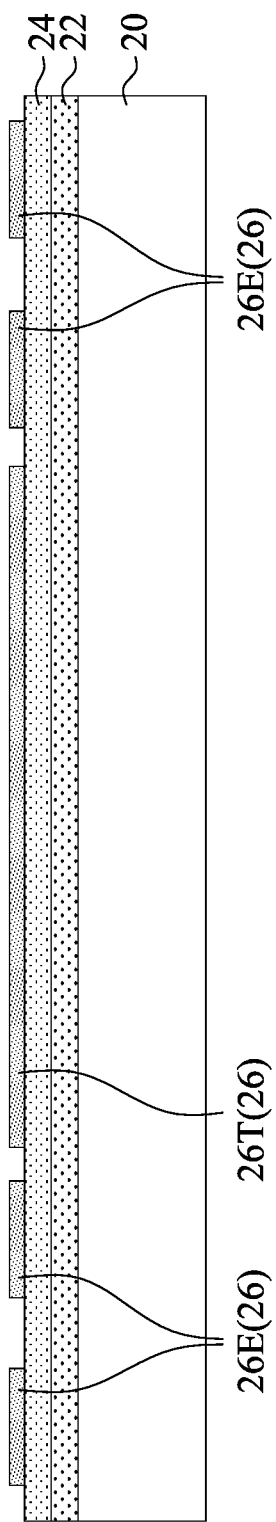

Next, metallic material 26B is deposited on the exposed portions of metal seed layer 26A. The respective process is illustrated as process 206 in the process flow 200 shown in FIG. 30. The deposition process may include a plating process, which may be an electro-chemical plating process or an electro-less plating process. Metallic material 26B may include Cu, Al, Ti, W, Au, or the like. After the plating process, the patterned plating mask 28 is removed, exposing the underlying portions of metal seed layer 26A. The respective process is illustrated as process 208 in the process flow 200 shown in FIG. 30. The exposed portions of metal seed layer 26A are then removed, leaving conductive (metallic) features 26 as shown in FIG. 3. Conductive features 26 include the remaining portions of metal seed layer 26A and the plated metallic material 26B. Conductive features 26 include thermal dissipation feature(s) 26T, and electrical Redistribution Lines (RDLs) 26E. In accordance with some embodiments, thermal dissipation features 26T are used for dissipating heat, and may or may not be used for the electrical functions of the resulting package. RDLs 26E, on the other hand, are used for the electrical functions.

Figure 4:
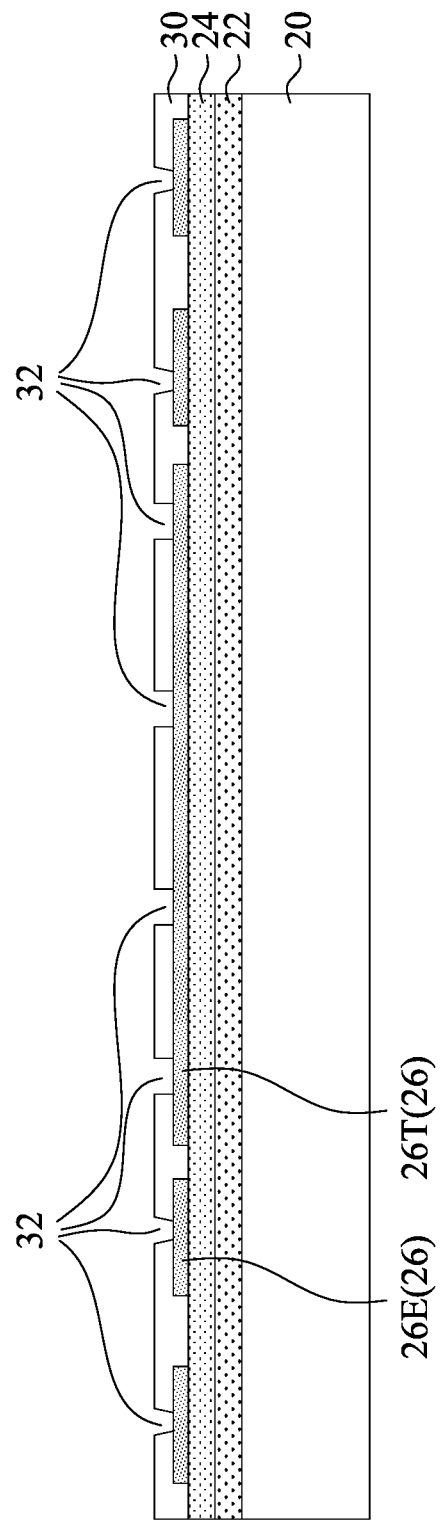

Further referring to FIG. 4, dielectric layer 30 is formed on thermal dissipation feature 26T and RDLs 26E. The respective process is illustrated as process 210 in the process flow 200 shown in FIG. 30. The bottom surface of dielectric layer 30 is in contact with the top surfaces of thermal dissipating feature 26T, RDLs 26E, and dielectric layer 24. In accordance with some embodiments of the present disclosure, dielectric layer 30 is formed of a polymer, which may be a photo-sensitive material such as PBO, polyimide, BCB, or the like. In accordance with alternative embodiments, dielectric layer 30 is formed of an inorganic dielectric material, which may include a nitride such as silicon nitride, or an oxide such as silicon oxide, phosphosilicate glass (PSG), borosilicate glass (BSG), boron-doped phosphosilicate glass (BPSG), fluorine-doped silicate glass (FSG), or the like. Dielectric layer 30 is then patterned to form openings 32 therein. Hence, some pad portions of thermal dissipation feature 26T and RDLs 26E are exposed through openings 32.

Figure 5:
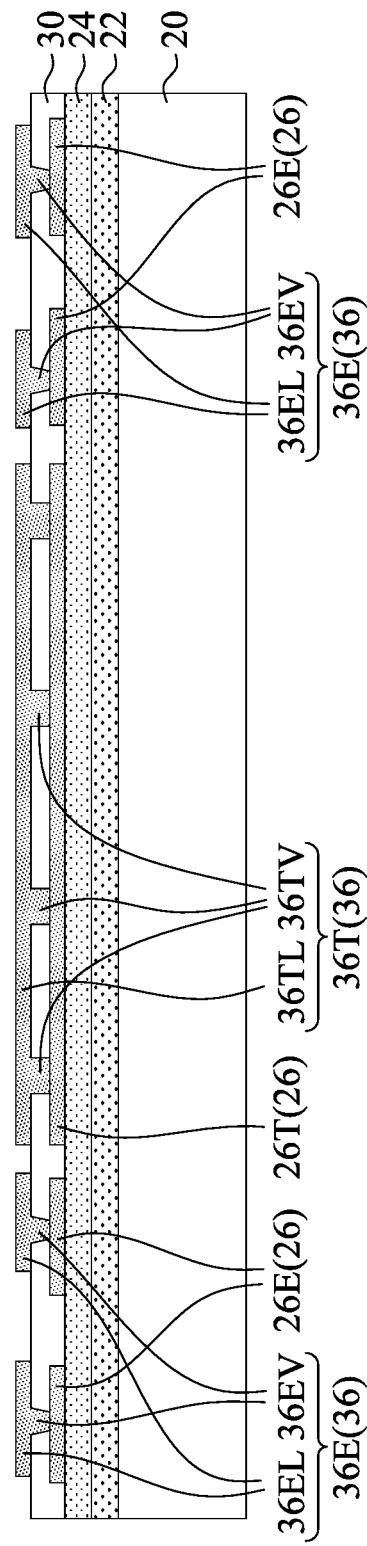

FIG. 5 illustrates the formation of conductive features 36, which include thermal dissipation feature 36T and RDLs 36E. The respective process is illustrated as process 212 in the process flow 200 shown in FIG. 30. Each of the conductive features 36 may include a via portion and a line portion. For example, thermal dissipation feature 36T may include line portion 36TL and via portion (also referred to as a via) 36TV. RDLs 36E may include line portions 36EL and the corresponding via portions (also referred to as vias) 36EV. In accordance with some embodiments, thermal dissipation feature 36T is in physical contact with thermal dissipation feature 26T. RDLs 36E are in contact with the respective underlying RDLs 26E. The formation of conductive features 36 may adopt the methods and materials similar to those for forming thermal dissipation feature 26T and RDLs 26E. Also, each of vias 36TV and 36EV may have a tapered profile, with the upper portions being wider than the corresponding lower portions.

Figure 6:
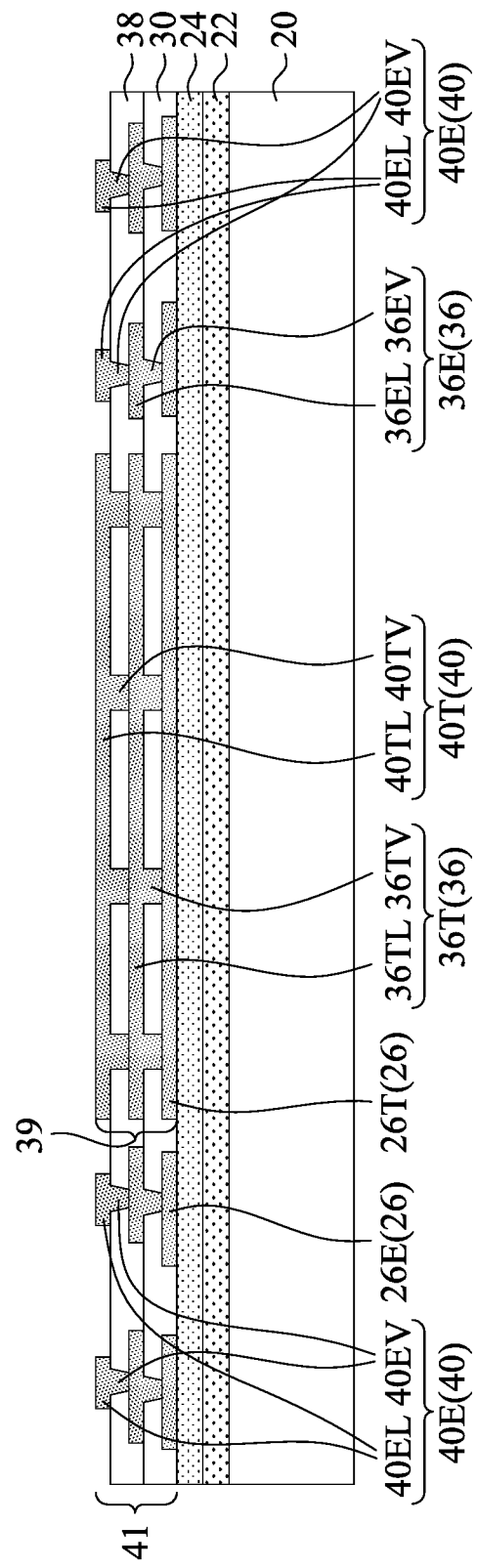

FIG. 6 illustrates the formation of dielectric layers 38 and conductive features 40, which include thermal dissipation feature 40T and RDLs 40E. RDLs 40E may include line portions 40EL and the corresponding via portions (also referred to as vias) 40EV. The respective processes are illustrated as processes 214 and 216 in the process flow 200 shown in FIG. 30. In accordance with some embodiments of the present disclosure, dielectric layer 38 is formed of a material selected from the same group of candidate materials for forming dielectric layers 38 and 30, and may include organic materials or inorganic materials, as aforementioned. It is appreciated that although in the illustrated example embodiments, two dielectric layers 30 and 38, and the respective thermal dissipation features 26T, 36T, and 40T and RDLs 26E, 36E, and 40E are discussed as examples, fewer or more dielectric layers and conductive layers may be adopted, depending on the signal routing requirement. Throughout the description, conductive features 26, 36, and 40 and dielectric layers 30 and 38 are collectively referred to as backside interconnect structure 41, which is on the backside of the subsequently placed device die. Thermal dissipation features 26T, 36T and 40T are collectively referred to as thermal dissipation block 39.

Figure 7:
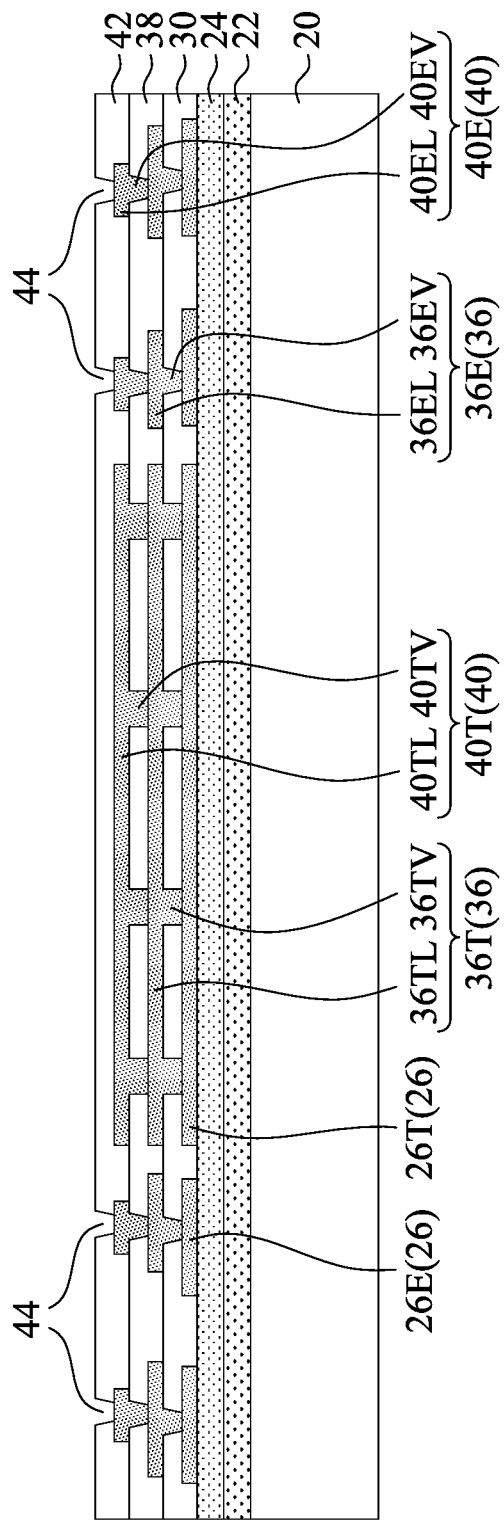

Referring to FIG. 7, dielectric layer 42 is formed to cover the underlying conductive features 40. The respective process is illustrated as process 218 in the process flow 200 shown in FIG. 30. In accordance with some embodiments, dielectric layer 42 may be formed of or comprises a material selected from the same group of candidate dielectric materials for forming the underlying dielectric layers 30 and 38. For example, dielectric layer 42 may be formed of a polymer, which may be a photo-sensitive material such as PBO, polyimide, BCB, or the like. In accordance with alternative embodiments, dielectric layer 42 is formed of an inorganic dielectric material, which may include a nitride such as silicon nitride, an oxide such as silicon oxide, or the like. Dielectric layer 42 is then patterned to form openings 44 therein.

Figure 8:
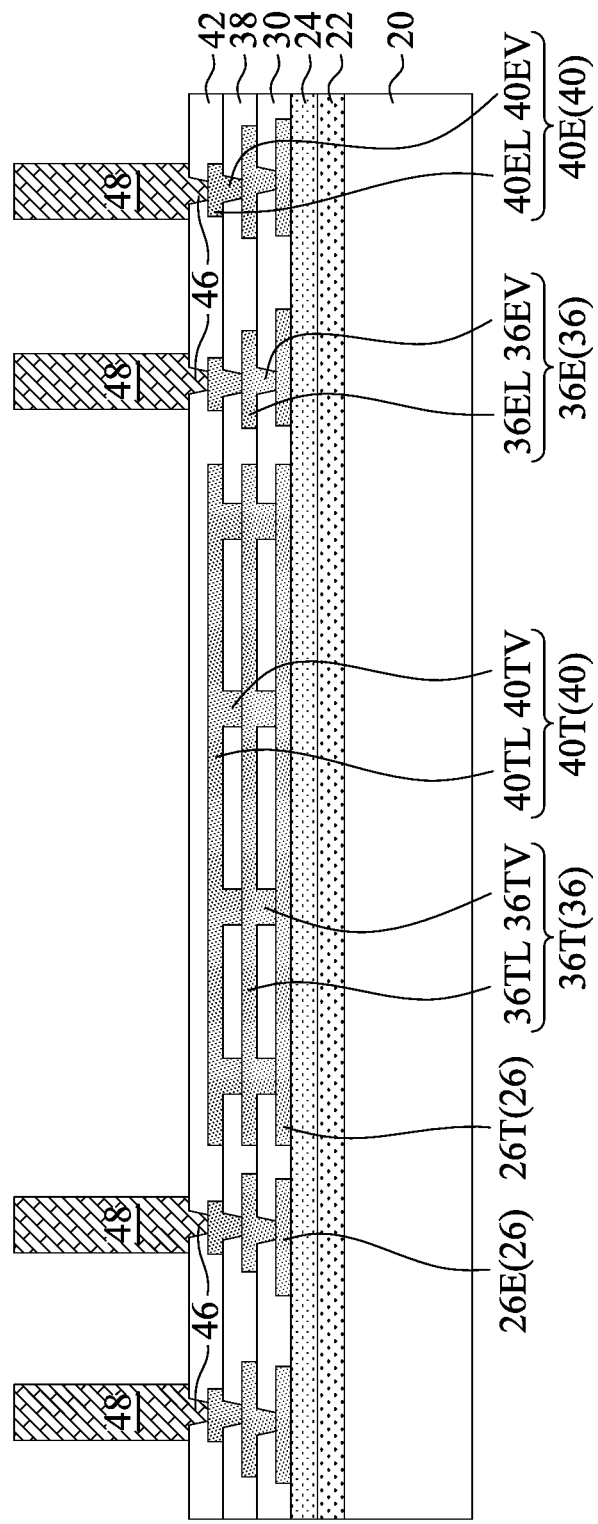

Referring to FIG. 8, vias 46 are formed in opening 44, and metal posts 48 are formed over and joined with vias 46. The respective process is illustrated as process 220 in the process flow 200 shown in FIG. 30. Vias 46 and metal posts 48 may be formed in common formation processes. In accordance with some embodiments, the formation processes include depositing a metal seed layer, forming a plating mask (not shown) over the metal seed layer, plating a metallic material in the openings in the plating mask, removing the plating mask, and etching the portions of the metal seed layer previously covered by the plating mask. In accordance with some embodiments of the present disclosure, the metal seed layer may include a titanium layer and a copper layer over the titanium layer. The formation of the metal seed layer may include PVD, CVD, or the like. The plating mask may include photo resist. The plated metallic material may include copper or a copper alloy, tungsten, or the like. The plated metallic material and the remaining portions of the metal seed layer thus form vias 46 and the metal posts 48.

Figure 9:
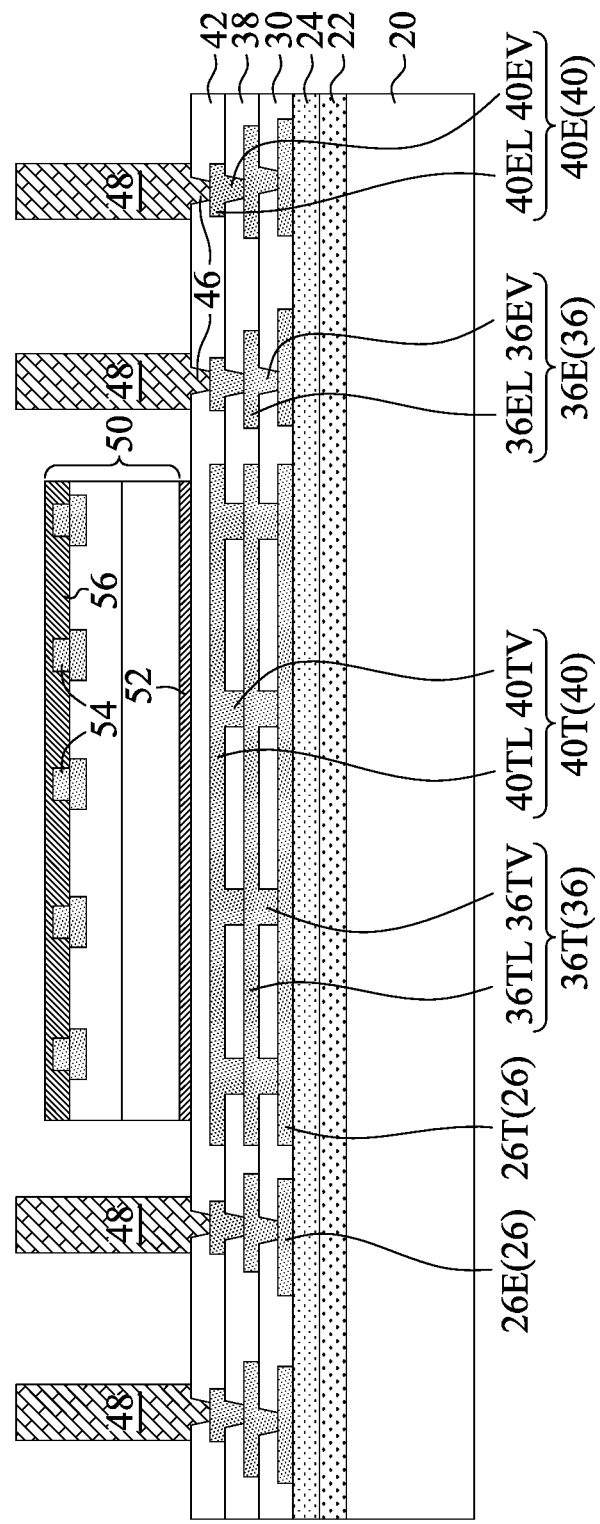

FIG. 9 illustrates the placement/attachment of package component 50, with Die-Attach Film (DAF) 52 being used to adhere package component 50 to dielectric layer 42. The respective process is illustrated as process 222 in the process flow 200 shown in FIG. 30. Although one package component 50 is illustrated, there may be a plurality of package components being placed, which may be the same as each other or different from each other. In accordance with some embodiments, package component 50 is a device die, a package with a device die(s) packaged therein, a System-on-Chip (SoC) die including a plurality of integrated circuits (or device dies) integrated as a system, or the like. The device die in package component 50 may be or may comprise a logic die, a memory die, an input-output die, an Integrated Passive Device (IPD), or the like, or combinations thereof. For example, the logic die in package component 50 may be a Central Processing Unit (CPU) die, a Graphic Processing Unit (GPU) die, a mobile application die, a Micro Control Unit (MCU) die, a BaseBand (BB) die, an Application processor (AP) die, or the like. The memory die in package component 50 may include a Static Random Access Memory (SRAM) die, a Dynamic Random Access Memory (DRAM) die, or the like. Package component 50 may include dielectric layer 56 and electrical connectors 54 (such as metal pillars, micro-bumps, and/or bond pads) embedded in dielectric layer 56.

Figure 10:
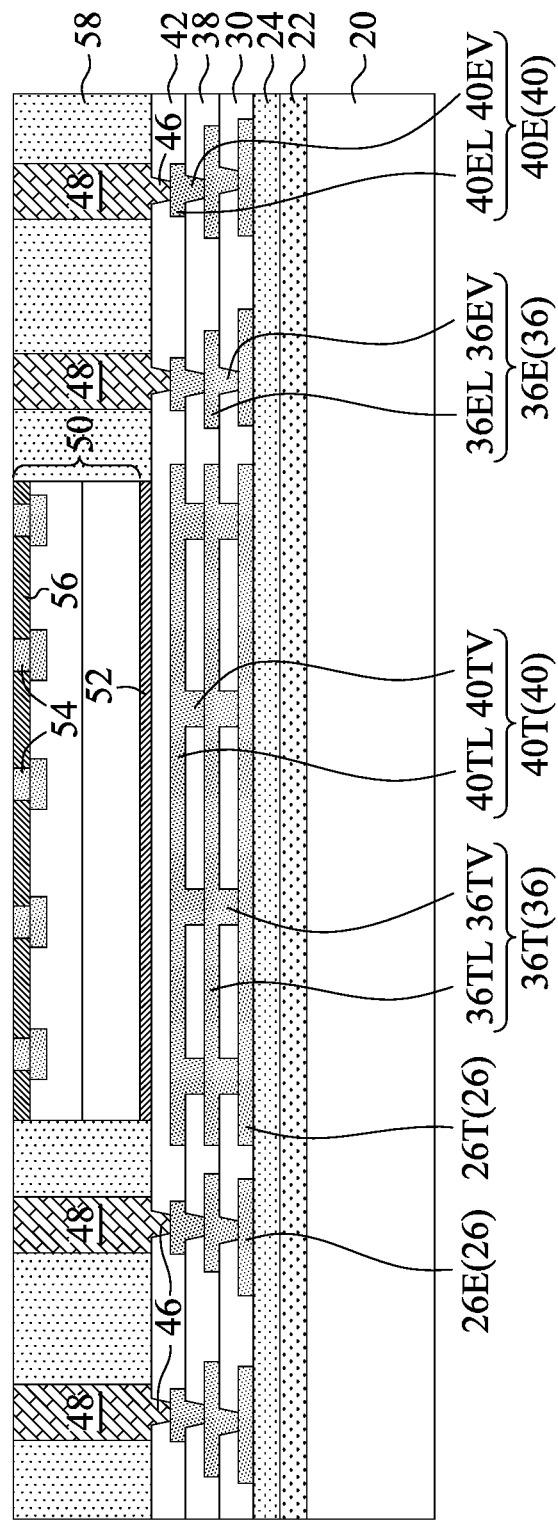

Next, encapsulant 58 is dispensed to encapsulate package component 50 and metal posts 48 there in, as shown in FIG. 10. The respective process is illustrated as process 224 in the process flow 200 shown in FIG. 30. Encapsulant 58 fills the gaps between neighboring metal posts 48 and the gaps between metal posts 48 and package component 50. Encapsulant 58 may include a molding compound, a molding underfill, an epoxy, and/or a resin. At the time of encapsulation, the top surface of encapsulant 58 is higher than the top ends of metal posts 48 and the top surfaces of package component 50. The molding compound may include a base material, which may be a polymer, a resin, an epoxy, or the like, and filler particles in the base material. The filler particles may be dielectric particles of silica, alumina, boron nitride, or the like, and may have spherical shapes. In a subsequent step, a planarization process such as a Chemical Mechanical Polish (CMP) process or a mechanical grinding process is performed to thin encapsulant 58 and package component 50, until both of electrical connectors 54 and metal posts 48 are revealed. Due to the planarization process, the top ends of electrical connectors 54 and metal posts 48 are level (coplanar) with the top surfaces of encapsulant 58. Metal posts 48 are alternatively referred to as through-vias 48 hereinafter since they penetrate through encapsulant 58.

Figure 11:
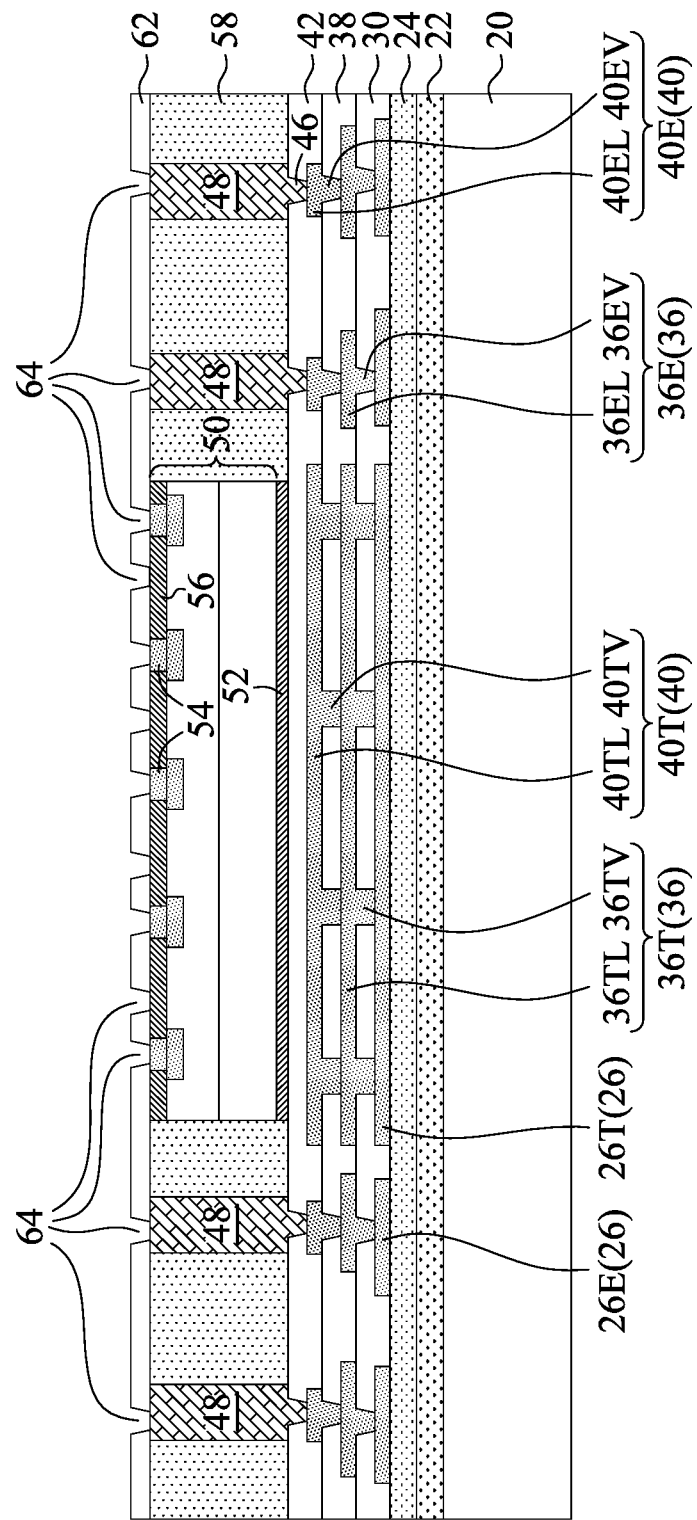
Figure 12:
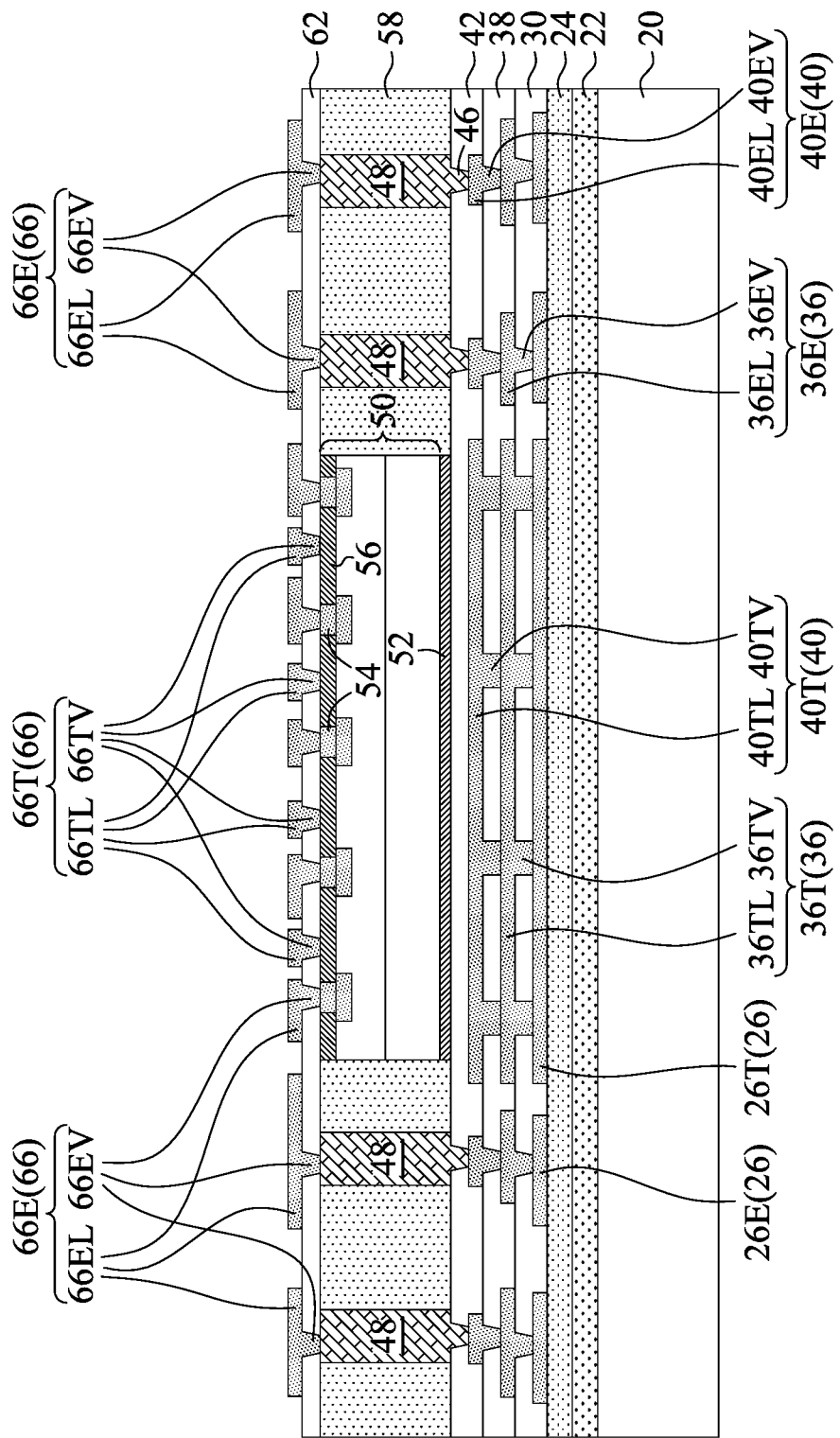
Figure 13:
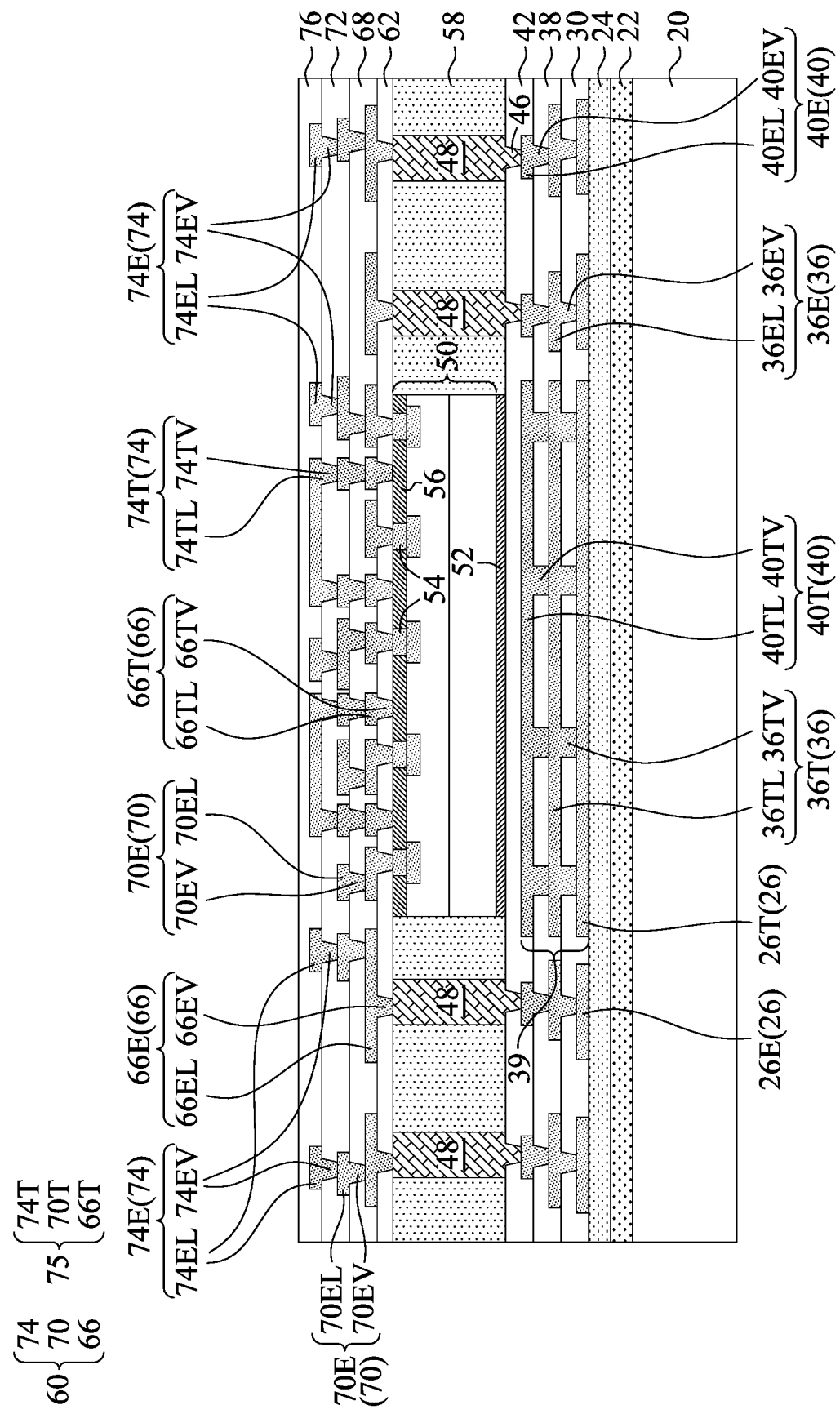

FIGS. 11 through 13 illustrate the formation of a front-side interconnect structure overlying and connecting to package component 50 and metal posts 48. The respective process is illustrated as process 226 in the process flow 200 shown in FIG. 30. FIGS. 11 and 12 illustrate the formation of a first layer of RDLs and the respective dielectric layer. Referring to FIG. 11, dielectric layer 62 is formed. In accordance with some embodiments of the present disclosure, dielectric layer 62 is formed of or comprises a polymer such as PBO, polyimide, BCB, or the like. The formation process includes coating dielectric layer 62 in a flowable form, and then curing dielectric layer 62. In accordance with alternative embodiments of the present disclosure, dielectric layer 62 is formed of an inorganic dielectric material such as silicon nitride, silicon oxide, or the like. The formation method may include CVD, Atomic Layer Deposition (ALD), Plasma-Enhanced Chemical Vapor Deposition (PECVD), or another applicable deposition method. Openings 64 are then formed, for example, through a photo lithography process. Through-vias 48 and electrical connectors 54 are exposed through openings 64.

Next, referring to FIG. 12, conductive features 66 are formed. Conductive features 66 include RDLs 66E, which are formed for electrical connection purpose. Conductive features 66 may or may not include thermal dissipation feature(s) 66T, which are used for thermal conduction. RDLs 66E and thermal dissipation features 66T are formed in common processes, which may be similar to the formation of the underlying conductive features 40 and 36. Each of the conductive features 36 may include a via portion and a line portion. For example, RDLs 66E may include line portions 66EL and the corresponding via portions (also referred to as vias) 66EV. Thermal dissipation feature 66T may include line portion 66TL. Thermal dissipation feature 66T may, or may not, include via portions (also referred to as a via(s)) 66TV. When via portions 66TV are not formed, the corresponding openings 64 (FIG. 11) will not be formed. In accordance with some embodiments, thermal dissipation feature 66T is in physical contact with dielectric layer 62, and may be in contact with dielectric layer 56 (if via portions 66TV are formed). In accordance with some embodiments, one of thermal dissipation feature 66T may also be electrically connected to an electrical connector 54, for example, so that the thermal dissipation feature 66T may be electrically connected to the electrical ground in package component 50. It is appreciated that since RDLs 66E need to be routed efficiently, if thermal dissipation features 66T are formed, they may be formed as smaller features than the underlying thermal dissipation features 26T, 36T, and 40T, and may be broken pieces (rather than being continuous large pieces as shown in FIGS. 18 through 29).

FIG. 13 illustrates the formation of dielectric layers 68, 72, and 76, and conductive features 70 and 74, which include RDLs 70E (including 70EL and 70EV) and 74E (including 74EL and 74EV), respectively. Conductive features 70 and 74 may include (or may not include) thermal dissipation features 70T (including 70TL and 70TV) and 74T (including 74TL and 74TV), respectively. Thermal dissipation feature 74T may be, or may not be, joined to the underlying thermal dissipation feature 70T, and thermal dissipation feature 70T may be, or may not be, joined to the underlying thermal dissipation feature 66T. Alternatively stated, thermal dissipation features 74T, 70T, and 66T may be, or may not be, interconnected. Some of the thermal dissipation features 74T, 70T, and 66T may be electrically floating. In accordance with some embodiments of the present disclosure, dielectric layers 68, 72, and 76 are formed of materials selected from the same group of candidate materials for forming dielectric layers 30 and 38, and may include organic materials or inorganic materials, as aforementioned.

In accordance with some embodiments, one or more of thermal dissipation features 74T, 70T, and 66T is electrically connected to one of electrical connectors 54. For example, some or all of the thermal dissipation features 74T, 70T, and 66T may be electrically connected to the electrical ground or a power supply voltage (such as VDD) through an electrical connector 54 of package component 50. Some or all of thermal dissipation features 74T, 70T, and 66T may be electrically and signally disconnected from package component 50. In accordance with some embodiments, thermal dissipation features 74T, 70T, and 66T are electrically grounded or connected to VDD, but do not have current flowing through them. Alternatively, some or all of thermal dissipation features 74T, 70T, and 66T are electrically floating. In accordance with some embodiments, some of thermal dissipation features 74T, 70T, and 66T are electrically connected to electrical ground (or VDD), while other portions of thermal dissipation features 74T, 70T, and 66T are electrically floating.

Figure 14:
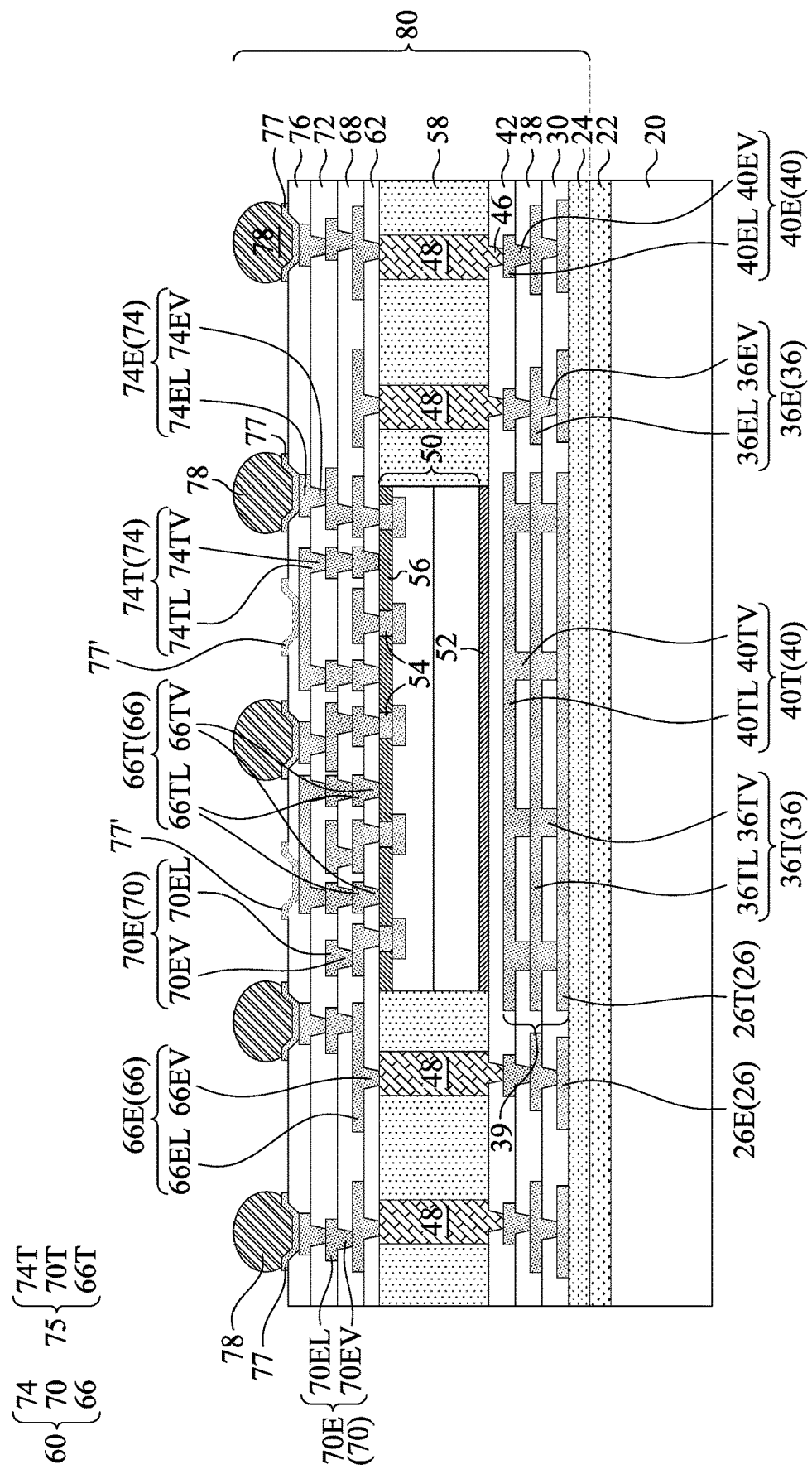

FIG. 14 illustrates the formation of Under-Bump Metallurgies (UBMs) 77, and electrical connectors 78 in accordance with some embodiments. The respective process is illustrated as process 228 in the process flow 200 shown in FIG. 30. To form UBMs 77, openings are formed in dielectric layer 76 to expose the underlying metal pads, which are parts of RDLs 74E in the illustrative embodiments. UBMs 77 may be formed of nickel, copper, titanium, or multilayers thereof. UBMs 77 may include a titanium layer and a copper layer over the titanium layer. In accordance with some embodiments, no UBM is formed to connect to thermal dissipation features 74T. In accordance with alternative embodiments, one or more of dummy UBMs 77' is formed to contact the respective thermal dissipation features 74T. Dummy UBMs 77' are illustrated using dashed lines to indicate that they may, or may not, be formed.

Electrical connectors 78 are then formed on UBMs 77. The formation of electrical connectors 78 may include placing solder balls on the exposed portions of UBMs 77, and then reflowing the solder balls, and hence electrical connectors 78 are solder regions. In accordance with alternative embodiments of the present disclosure, the formation of electrical connectors 78 includes performing a plating process to form solder layers, and then reflowing the solder layers. Electrical connectors 78 may also include non-solder metal pillars, or metal pillars and solder caps over the non-solder metal pillars, which may also be formed through plating. Throughout the description, the structure over release film 22 is referred to as reconstructed wafer 80.

Throughout the description, conductive features 66, 70 and 74 are collectively referred to as front-side interconnect structure 60, which includes RDLs 66E, 70E, and 74E. Front-side interconnect structure 60 may or may not include thermal dissipation block 75, which includes thermal dissipation features 66T, 70T, and 74T. Thermal dissipation block 75 may or may not include dummy UBMs 77'. In accordance with some embodiments, both of backside thermal dissipation block 39 and front-side thermal dissipation block 75 are formed. In accordance with alternative embodiments, backside thermal dissipation block 39 is formed, while front-side thermal dissipation block 75 is not formed. In accordance with yet alternative embodiments, front-side thermal dissipation block 75 is formed, while backside thermal dissipation block 39 is not formed.

Figure 15:
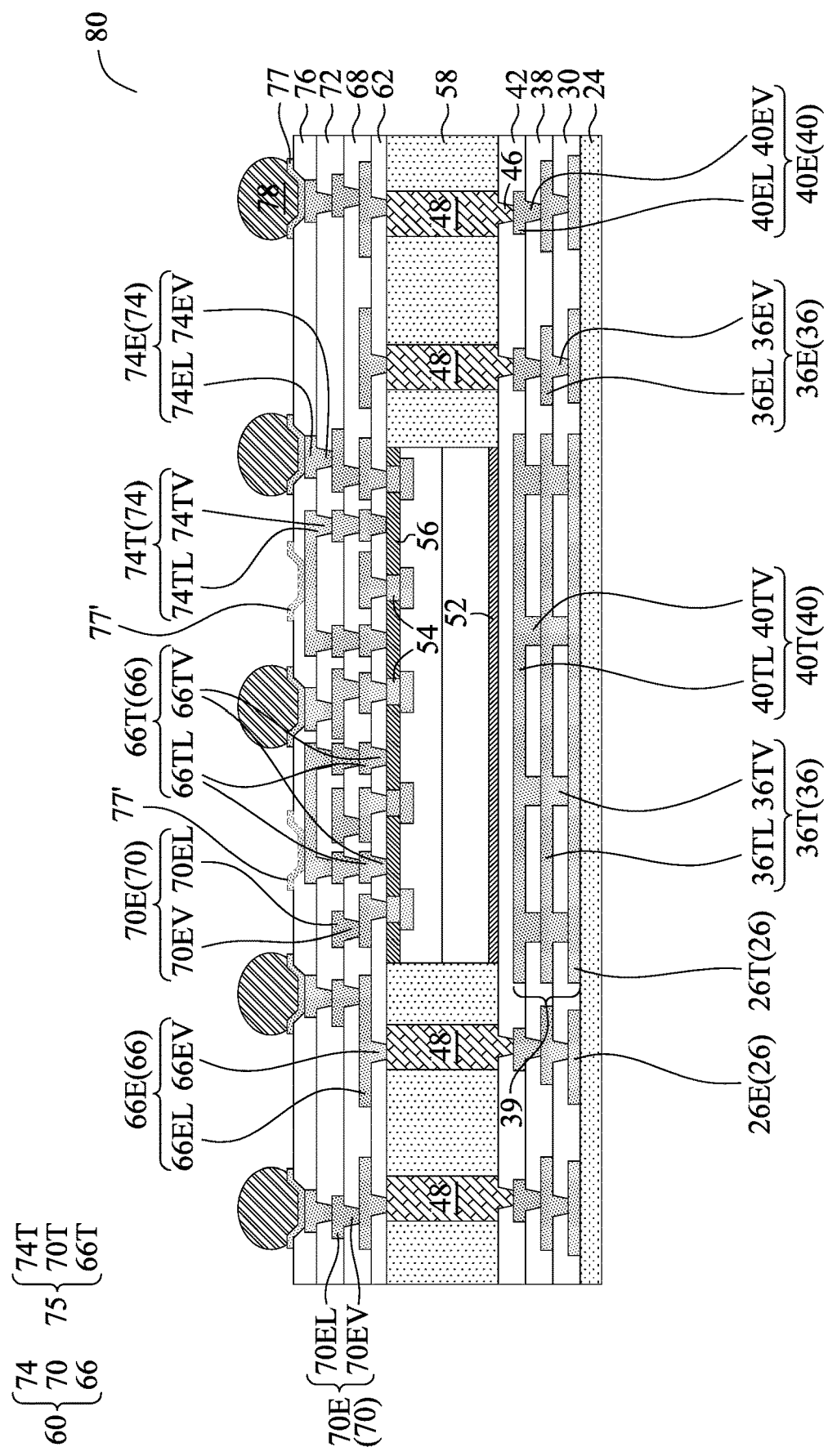

Next, reconstructed wafer 80 is de-bonded from carrier 20, and the resulting reconstructed wafer 80 is shown in FIG. 15. The respective process is illustrated as process 230 in the process flow 200 shown in FIG. 30. In accordance with some embodiments, a light beam (which may be a laser beam) is projected on release film 22, and the light beam penetrates through the transparent carrier 20. Release film 22 is thus decomposed. Carrier 20 may be lifted off from release film 22, and hence reconstructed wafer 80 is de-bonded (de-mounted) from carrier 20.

Figure 16:
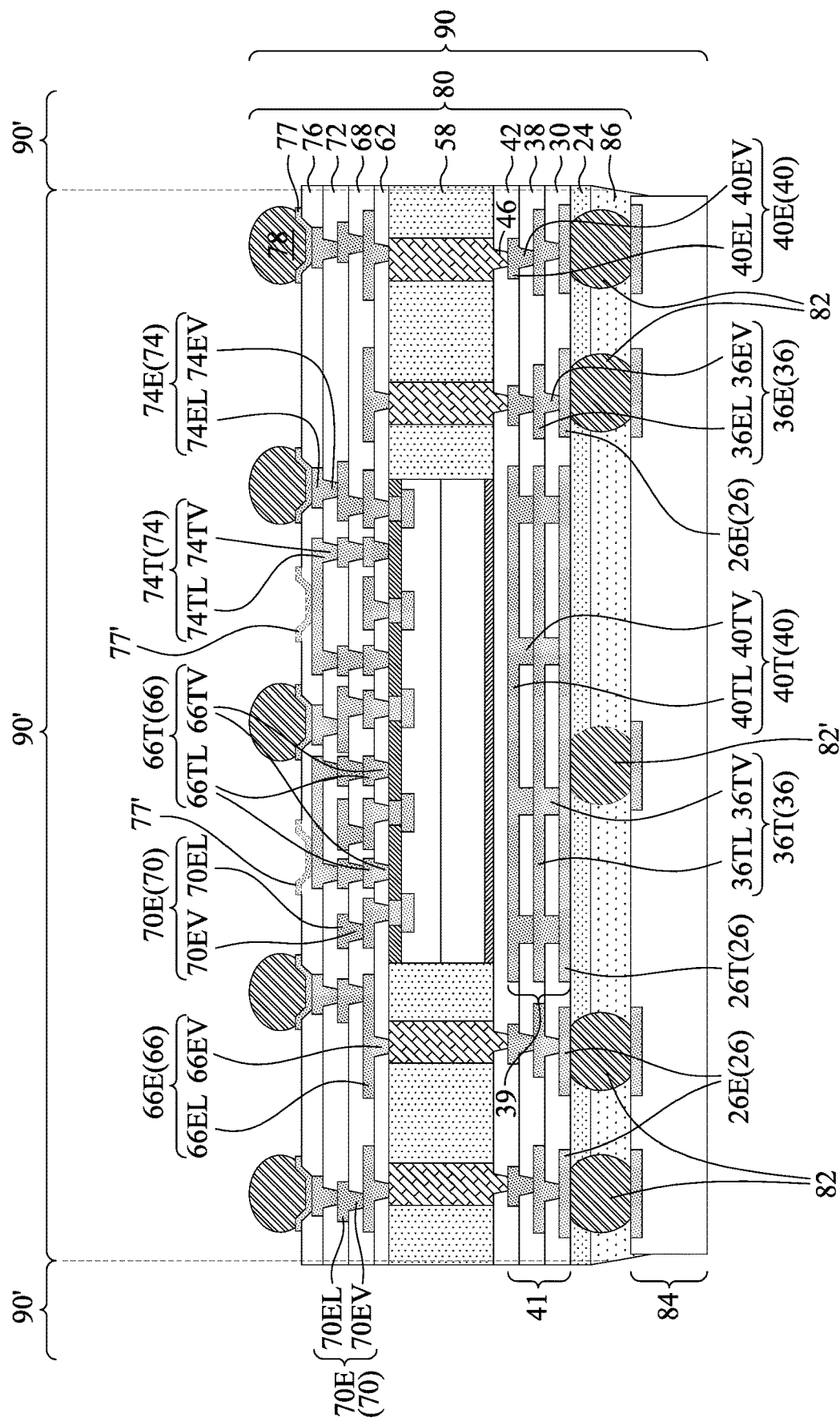

FIG. 16 illustrates the formation of electrical connectors 82 penetrating through dielectric layer 24 to contact RDLs 26E. The respective process is illustrated as process 232 in the process flow 200 shown in FIG. 30. In accordance with some embodiments, openings (occupied by electrical connectors 82) are formed in dielectric layer 24. The formation process may include a laser drill process performed using a laser beam, wherein RDLs 26E act as the stop layers for the laser drill. Some portions of RDLs 26E are exposed through the openings. Electrical connectors 82 are formed extending into the openings. In accordance with some embodiments, electrical connectors 82 are formed of or comprise solder. In accordance with alternative embodiments, electrical connectors 82 are formed of or comprise metal pads, metal pillars, or the like, and may or may not include solder.

In accordance with some embodiments, no electrical connector is formed to join to thermal dissipation block 39. In accordance with alternative embodiments, an electrical connector 82' is formed to contact thermal dissipation feature 26T, and is electrically connected to thermal dissipation block 39. Electrically connector 82' is illustrated using dashed lines to indicate that it may, or may not, be formed. It is appreciated that electrical connector 82' is a dummy feature, which is not for conducting current.

In accordance with some embodiments, thermal dissipation block 39 is electrically connected to electrical ground (or power supply node VDD), either through electrical connector 82, or through the electrical ground in package component 50. When thermal dissipation block 39 is electrically connected to the electrical ground or VDD, no current flows through thermal dissipation block 39. In accordance with some embodiments, thermal dissipation block 39 is a terminal node of the corresponding electrical path, where electrical connection ends in thermal dissipation block 39. Alternatively, thermal dissipation block 39 is electrically floating. There may also be some thermal dissipation features 26T, 30T, and 34T (if they are not interconnected) electrically connected to electrical ground or VDD, while some others are electrically floating.

Figure 17:
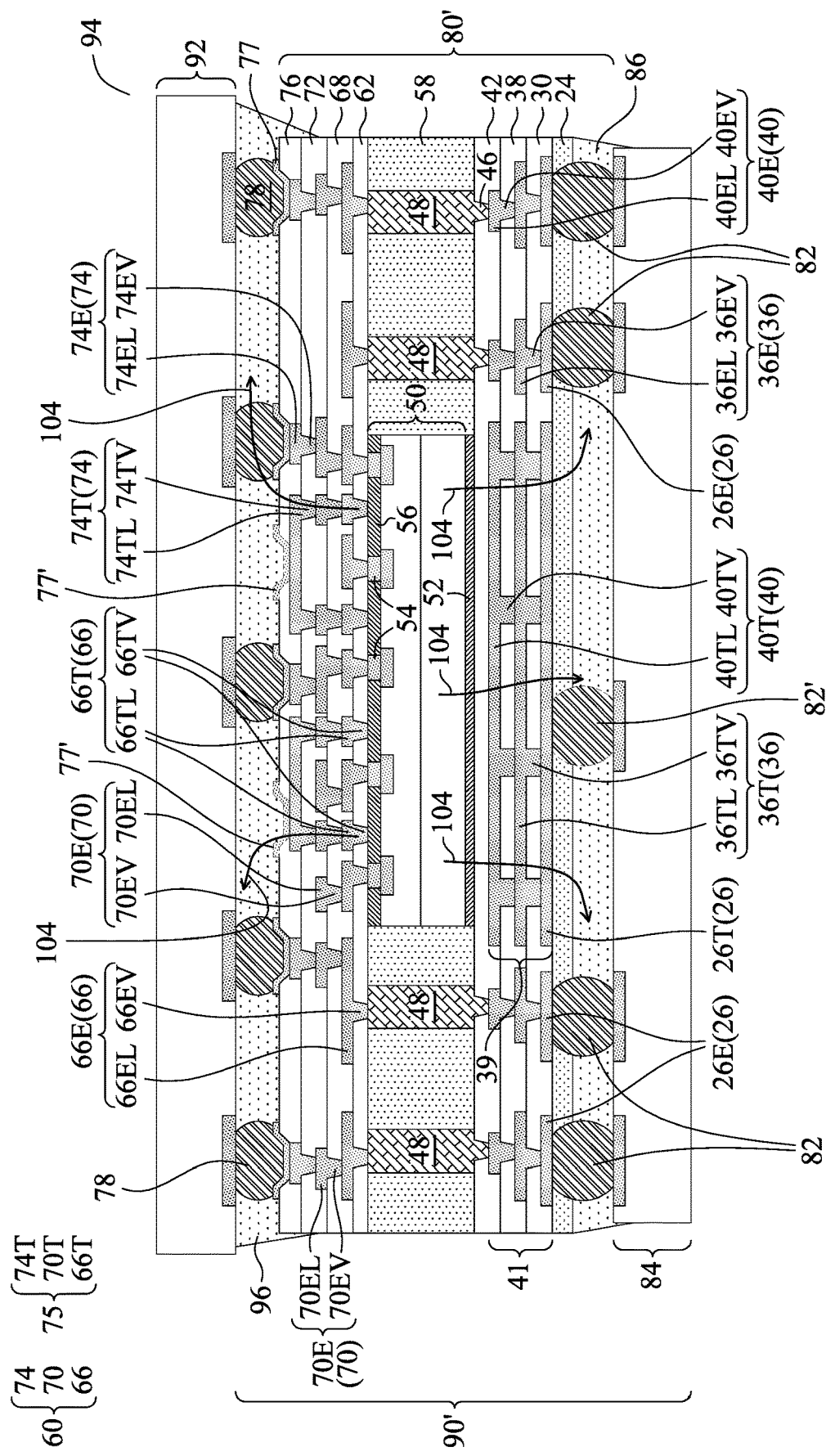

Next, as shown in FIG. 17, package component 84 is bonded to reconstructed wafer 80 through electrical connectors 82. The respective process is illustrated as process 234 in the process flow 200 shown in FIG. 30. Although one package component 84 is illustrated, there may be a plurality of identical package components 84 bonded to reconstructed wafer 80. In accordance with some embodiments, package component 84 is a device die, a package, or the like. Underfill 86 may be dispensed between package component 84 and reconstructed wafer 80. In subsequent discussion, reconstructed wafer 80 and the package components 84 bonded thereon are collectively referred to as reconstructed wafer 90.

Next, reconstructed wafer 90 is placed on a dicing tape (not shown), which is attached to a frame (not shown). In accordance with some embodiments of the present disclosure, reconstructed wafer 90 is singulated in a die-saw process, for example, using a blade, and is separated into discrete packages 90'. The respective process is illustrated as process 236 in the process flow 200 shown in FIG. 30.

FIG. 17 illustrates the bonding of package 90' with package component 92 to form package 94. The respective process is illustrated as process 238 in the process flow 200 shown in FIG. 30. In accordance with some embodiments, package component 92 is or comprises a package substrate, an interposer, another package, or the like. Underfill 96 may be dispensed into the gap between package 90' and package component 92. In accordance with some embodiments in which dummy UBMs 77' are formed, underfill 96 is in contact with dummy UBMs 77'.

In accordance with some embodiments, thermal dissipation block 39 is overlapped by a majority (such as more than 70 percent) of package component 50. Thermal dissipation block 39 may also have edges vertically aligned to or extend laterally beyond the respective edges of the overlying package component 50. In accordance with some embodiments, there is no RDL (for routing electrical signals) directly underlying package component 50.

FIGS. 18 through 21 illustrate the top views of thermal dissipation features 26T, 36TL, 36TV, 40TL, and 40TV in accordance with some embodiments. It is appreciated that the illustrated shapes are among the possible candidate shapes of the features, and other shapes may also be adopted. In the following discussion, the line portions 26T, 36TL, and 40TL may be alternatively referred to as thermal dissipation features, and via portions 36TV and 40TV may alternatively referred to as vias.

Figure 18:
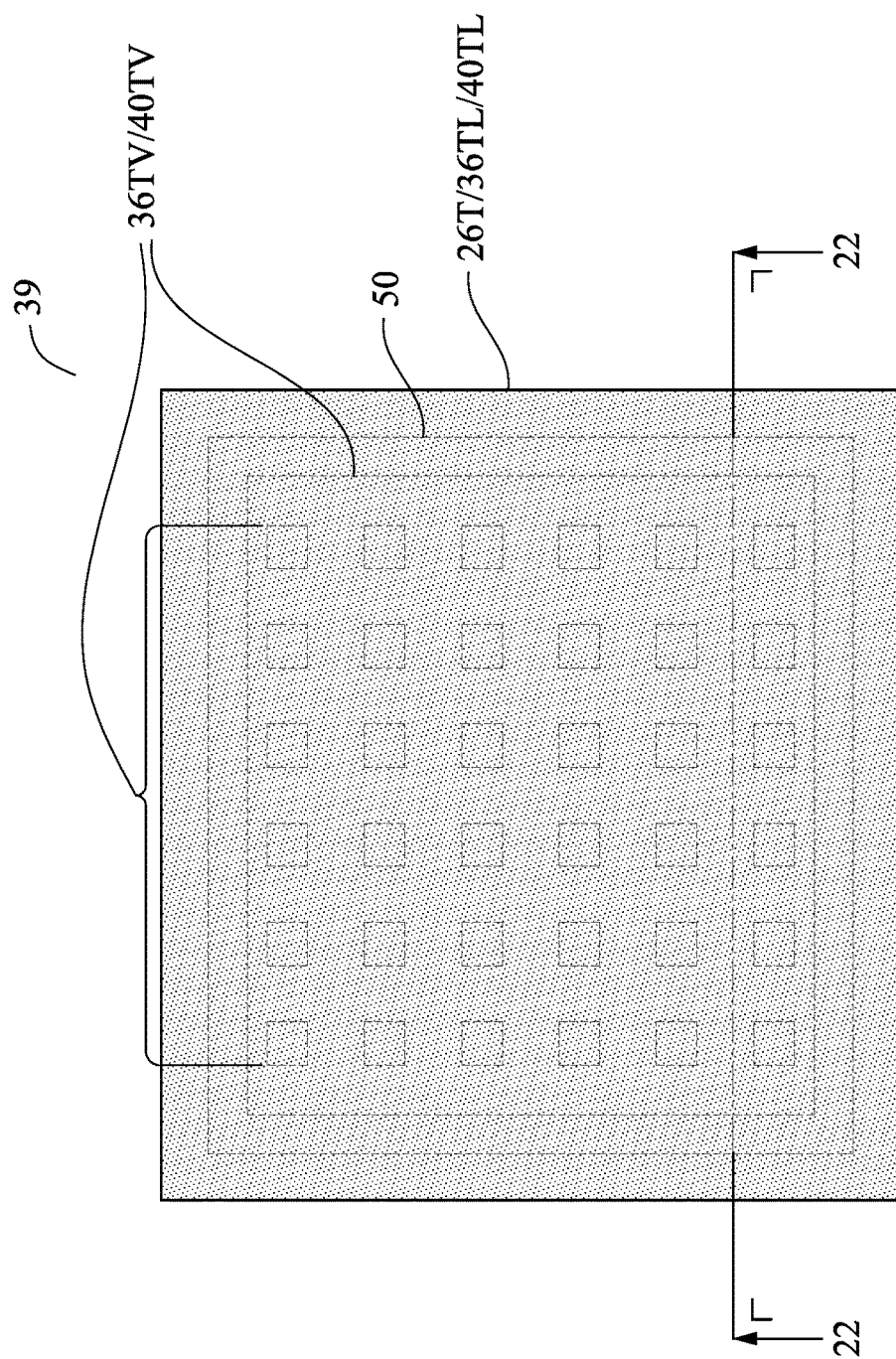
FIGS. 18-21 illustrate the top views of thermal dissipation blocks in accordance with some embodiments.

Referring to FIG. 18, thermal dissipation features 26T, 36TL, and 40TL may be solid metal plates, with no openings formed therein. In accordance with some embodiments, the edges of thermal dissipation features 26T, 36TL, and 40TL extend laterally beyond the respective edges of the underlying package component 50. In accordance with alternative embodiments, the edges of thermal dissipation features 26T, 36TL, and 40TL are vertically aligned to, or laterally recessed from, the respective edges of the underlying package component 50. In accordance with some embodiments, two neighboring thermal dissipation features 26T, 36TL, and 40TL may be connected through single large vias 36TV and 40TV as illustrated, or alternatively, through a plurality of small vias, also illustrated.

Figure 19:
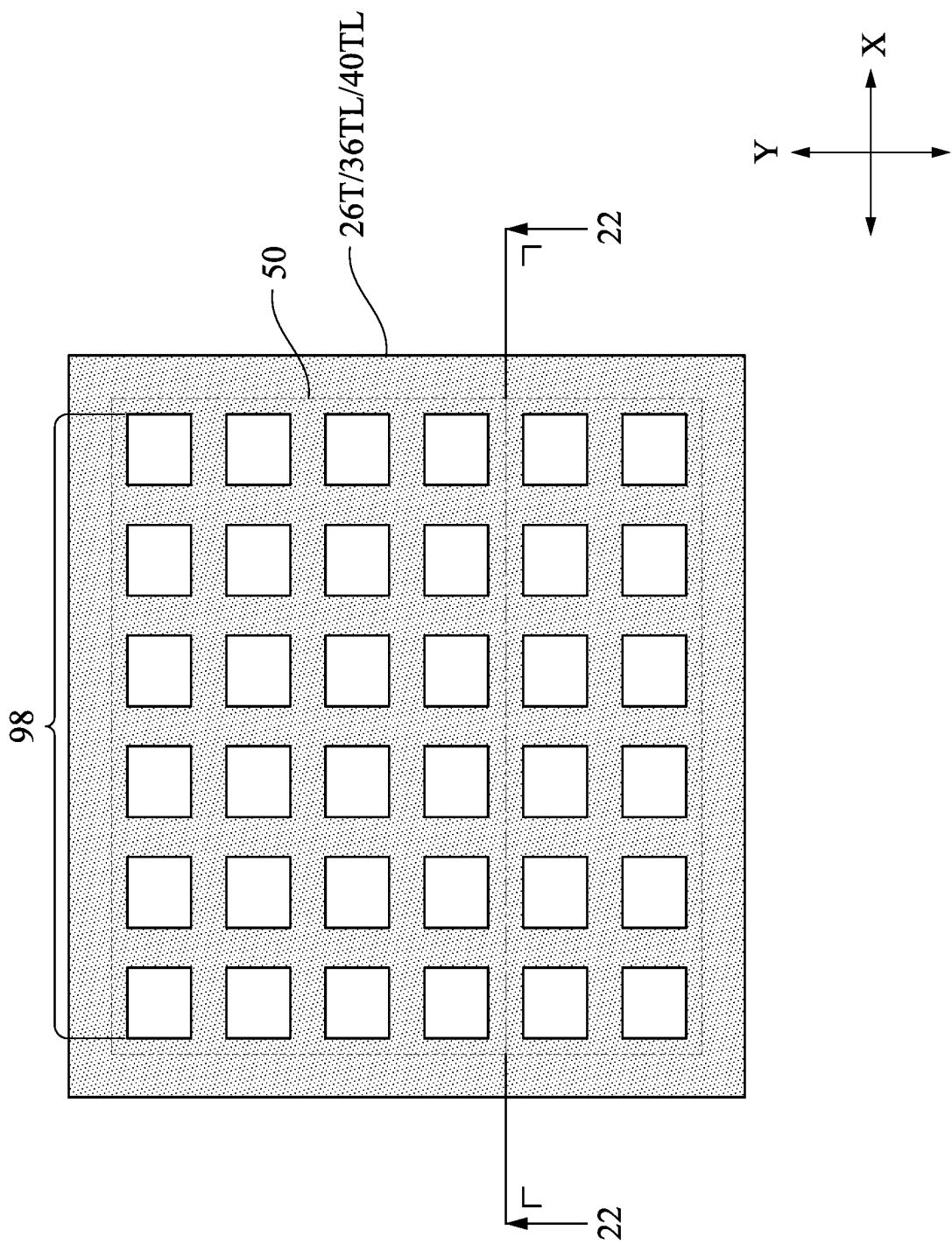

FIG. 19 illustrates the candidate shapes of thermal dissipation features 26T, 36TL, and/or 40TL in accordance with alternative embodiments, wherein one or more of thermal dissipation features 26T, 36TL, and/or 40TL may have a mesh shape. The mesh includes a first plurality of metal strips extending in X-direction joined to a second plurality of metal strips extending in Y-direction, so that openings 98 are formed. In accordance with some embodiments, the edges of thermal dissipation features 26T, 36TL, and 40TL extend laterally beyond the respective edges of the underlying package component 50. In accordance with alternative embodiments, the edges of thermal dissipation features 26T, 36TL, and 40TL are vertically aligned to, or laterally recessed from, the respective edges of the underlying package component 50.

Figure 20:
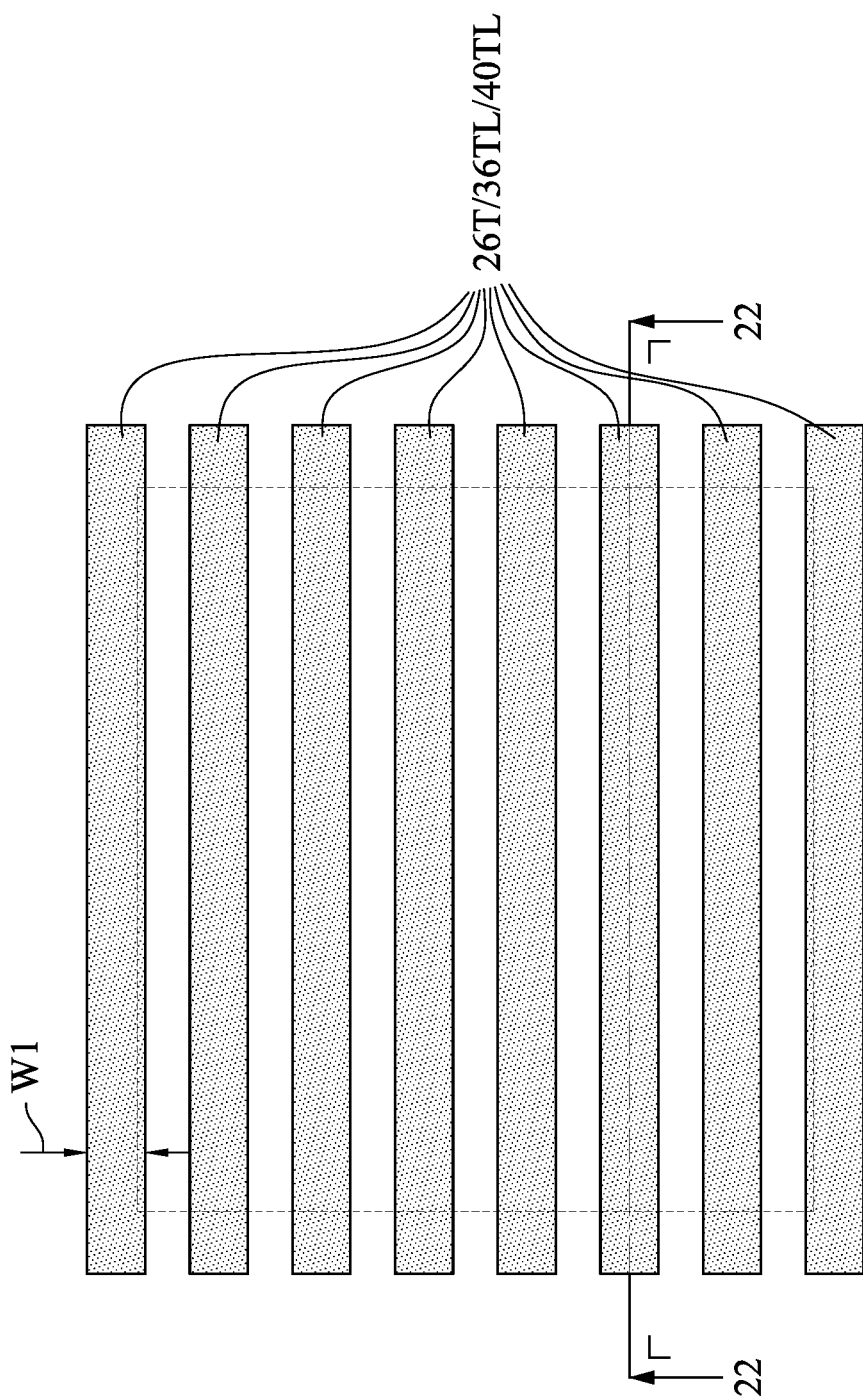

FIG. 20 illustrates the candidate shapes of thermal dissipation features 26T, 36TL, or 40TL in accordance with alternative embodiments. The illustrated thermal dissipation features 26T, 36TL, or 40TL include a plurality of elongated strips that are separated from each other. The widths (for example, width Wi) of the strips may be greater than about 5 μm, greater than about 10 μm, or even greater. FIG. 20 includes that thermal dissipation features 26T, 36TL, or 40TL are laid out in a single column and a plurality of rows. In accordance with alternative embodiments, thermal dissipating features 26T, 36TL, and 40TL may be arranged as an array or other repeating patterns such as a honeycomb pattern. For example, each of the strips may be separated into two, three or more portions, so that the resulting dissipating features 26T, 36TL, and 40TL are arranged as an array.

Figure 21:
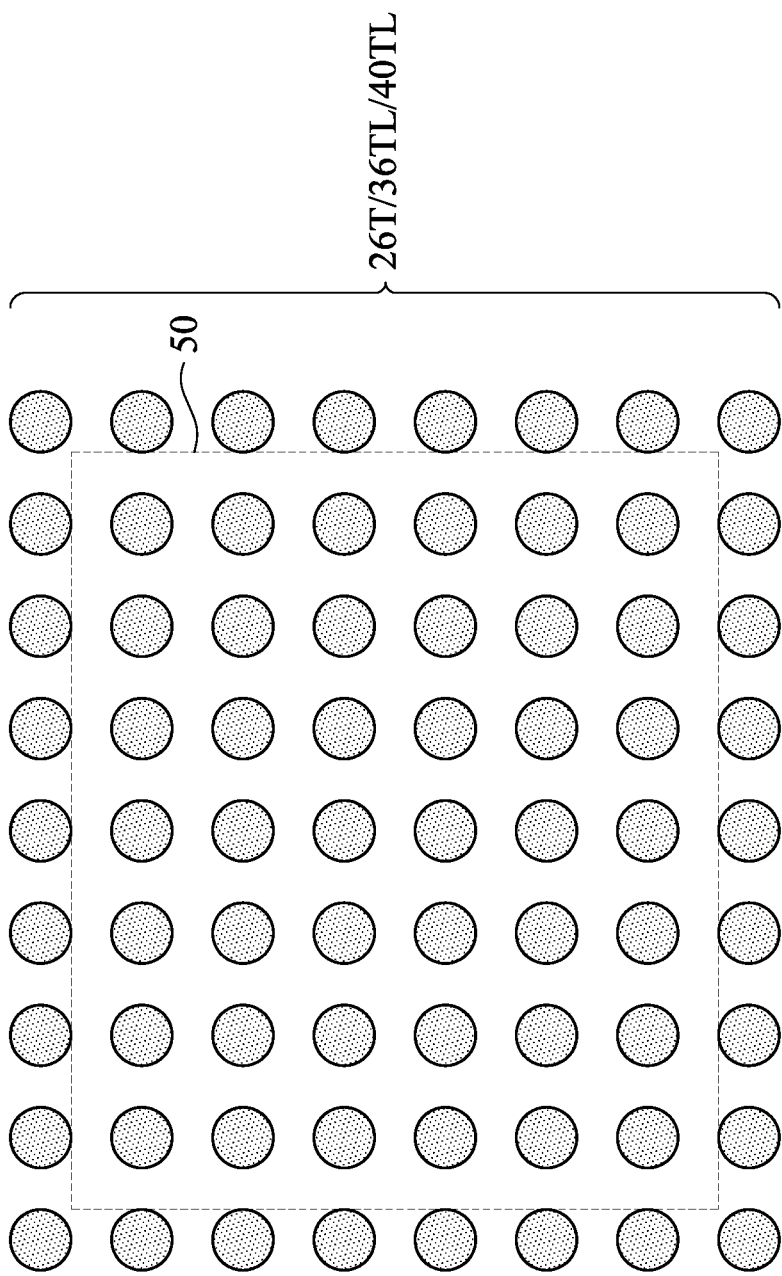

FIG. 21 illustrates the candidate shapes of thermal dissipation features 26T, 36TL, and 40TL in accordance with alternative embodiments. The illustrated thermal dissipation features 26T, 36TL, and 40TL are small metal pads arranged as an array or other repeating patterns such as a honeycomb pattern. The top-view shapes of thermal dissipation features 26T, 36TL, and 40TL include, and are not limited to, circles, rectangles, hexagons, or the like.

Dissipating features 26T, 36TL, and 40TL in combination form thermal dissipation block 39 along with the connecting vias 36TV and 40TV. FIGS. 23 through 27 illustrate some example embodiments shown how two neighboring metal layers in thermal dissipation block 39 may be laid out, and how the neighboring thermal dissipation features 26T, 36TL, and 40TL are interconnected through via portions 40TV and 36TV.

Figure 22:
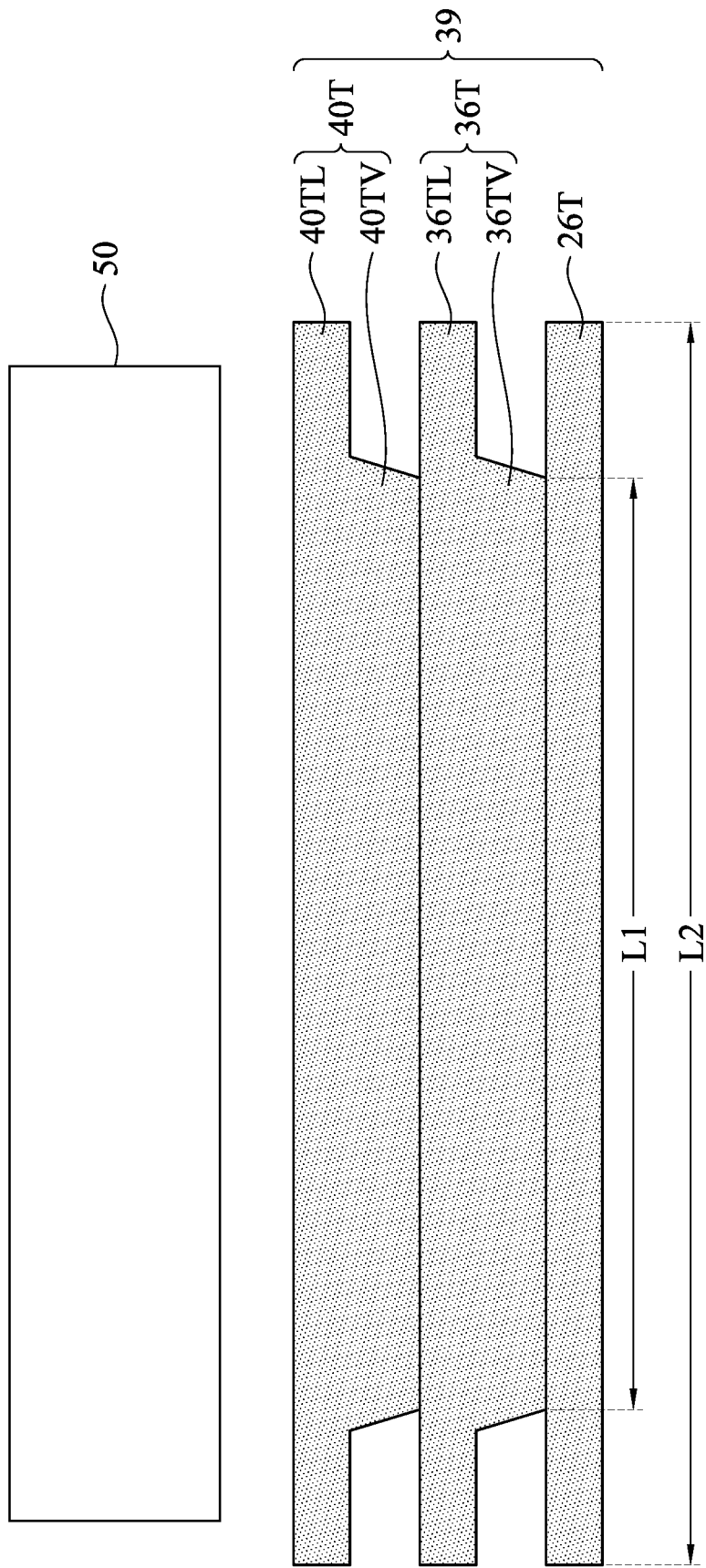
FIG. 22 illustrates a cross-sectional view of a thermal dissipation block including line portions and via portions in accordance with some embodiments.

FIG. 22 illustrate a cross-sectional view of the line portions 40TL and 36TL and their respective via portions 40TV and 36TV in accordance with some embodiments. The cross-sectional views may be obtained from the cross-sections 22-22 in FIGS. 18, 19, and 20. Each of the via portions 40TV and 36TV may be a single large via having length L1 greater than about 50 percent, or greater than about 70 percent of the corresponding length L2 of the corresponding overlying line portion. In accordance with alternative embodiments, instead of forming large vias, smaller vias may be formed, which are illustrated in the top views in FIGS. 18, 23, and 24. The thickness of the line portions 26T, 36TL, and 40TL may be greater than about 10 μm. Through via portions 40TV and 36TV, all of line portions 26T, 36TL, and 40TL in thermal dissipation block 39 may be electrically interconnected as a single integrated conductive feature or several integrated features that are electrically disconnected from each other.

Figure 23:
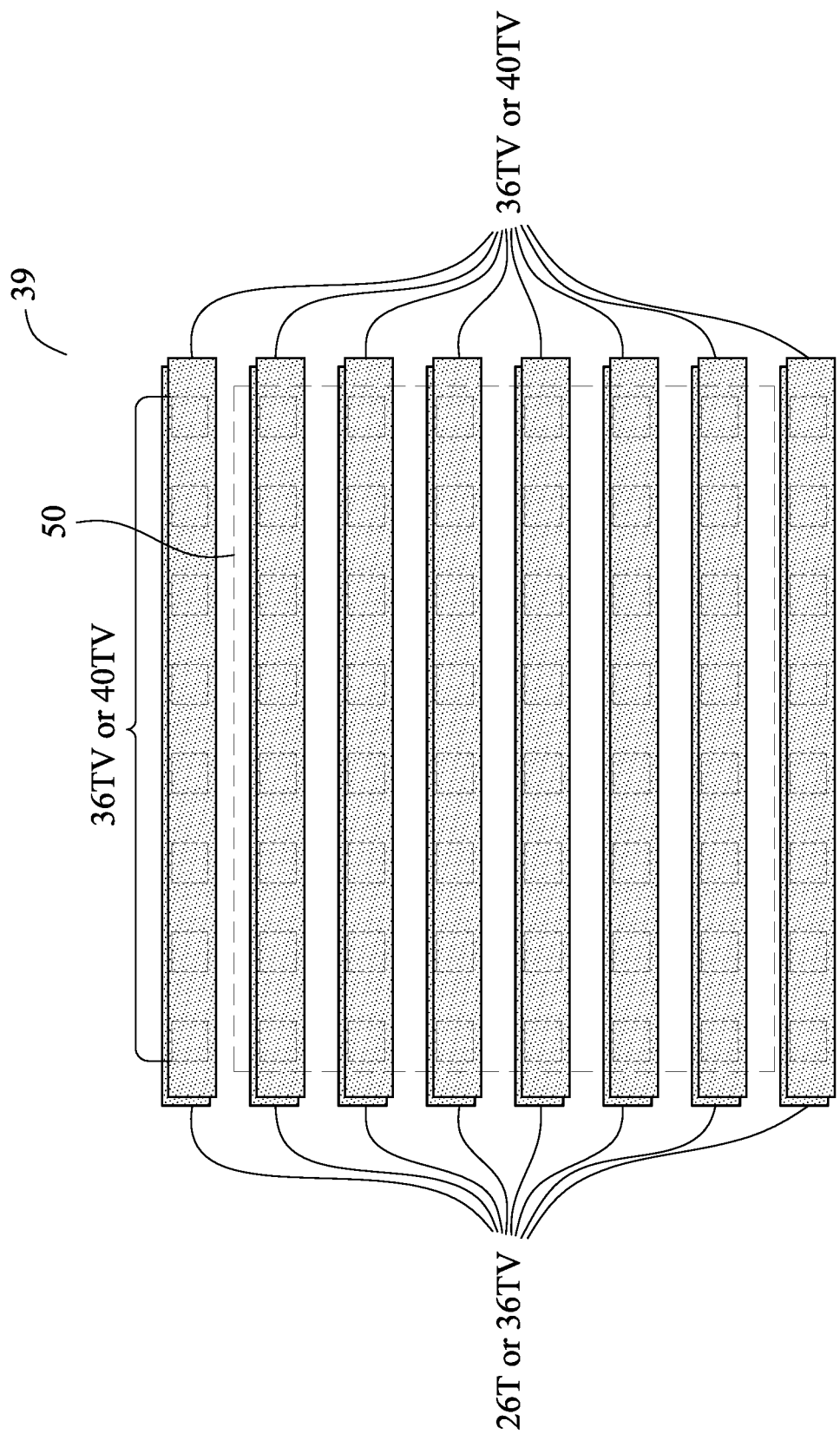
FIGS. 23-27 illustrate the top views of two metal layers in thermal dissipation blocks in accordance with some embodiments.

Referring to FIG. 23, thermal dissipation features 36TL or 40TL are parallel with each other, and higher ones of thermal dissipation features 36TL or 40TL may overlap the corresponding underlying thermal dissipation features 26TL or 36TL. In accordance with some embodiments, all of the thermal dissipation features 26T, 36TL, and 40TL are stacked, with the higher ones overlapping the underlying ones. Vias 36TV and 40TV are used to interconnect the neighboring layers of thermal dissipation features 26T, 36TL, and 40TL.

Figure 24:
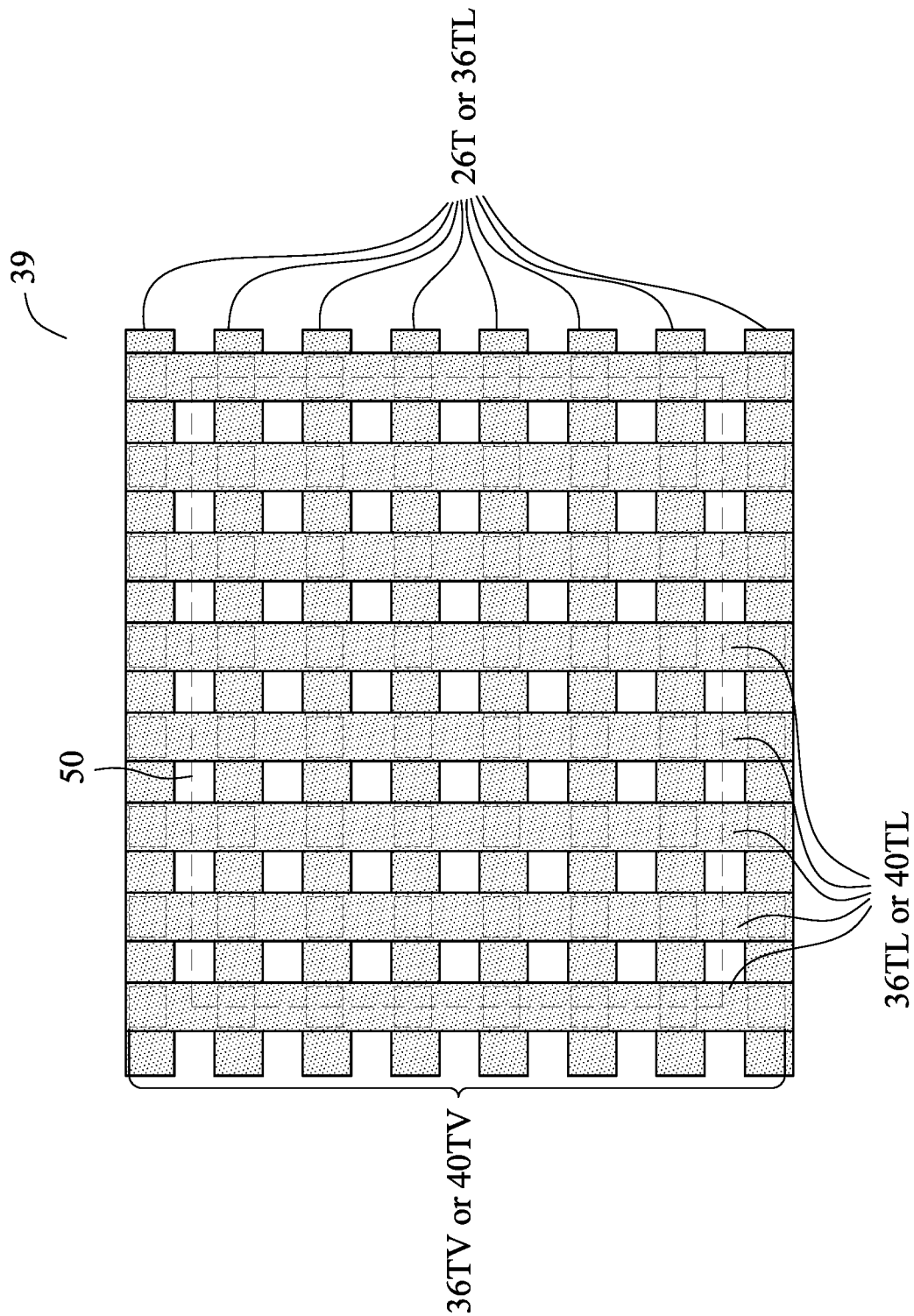

Referring to FIG. 24, thermal dissipation features 36T are parallel to each other, and are perpendicular to the underlying thermal dissipation features 26T and/or the overlying thermal dissipation features 40T. Accordingly, in the top view, the metal strips in neighboring metal layers in combination form a mesh. Vias 36TV and/or 40TV are formed where overlapping occur to interconnect the neighboring layers of thermal dissipation features 26T, 36TL, and 40TL.

Figure 25:
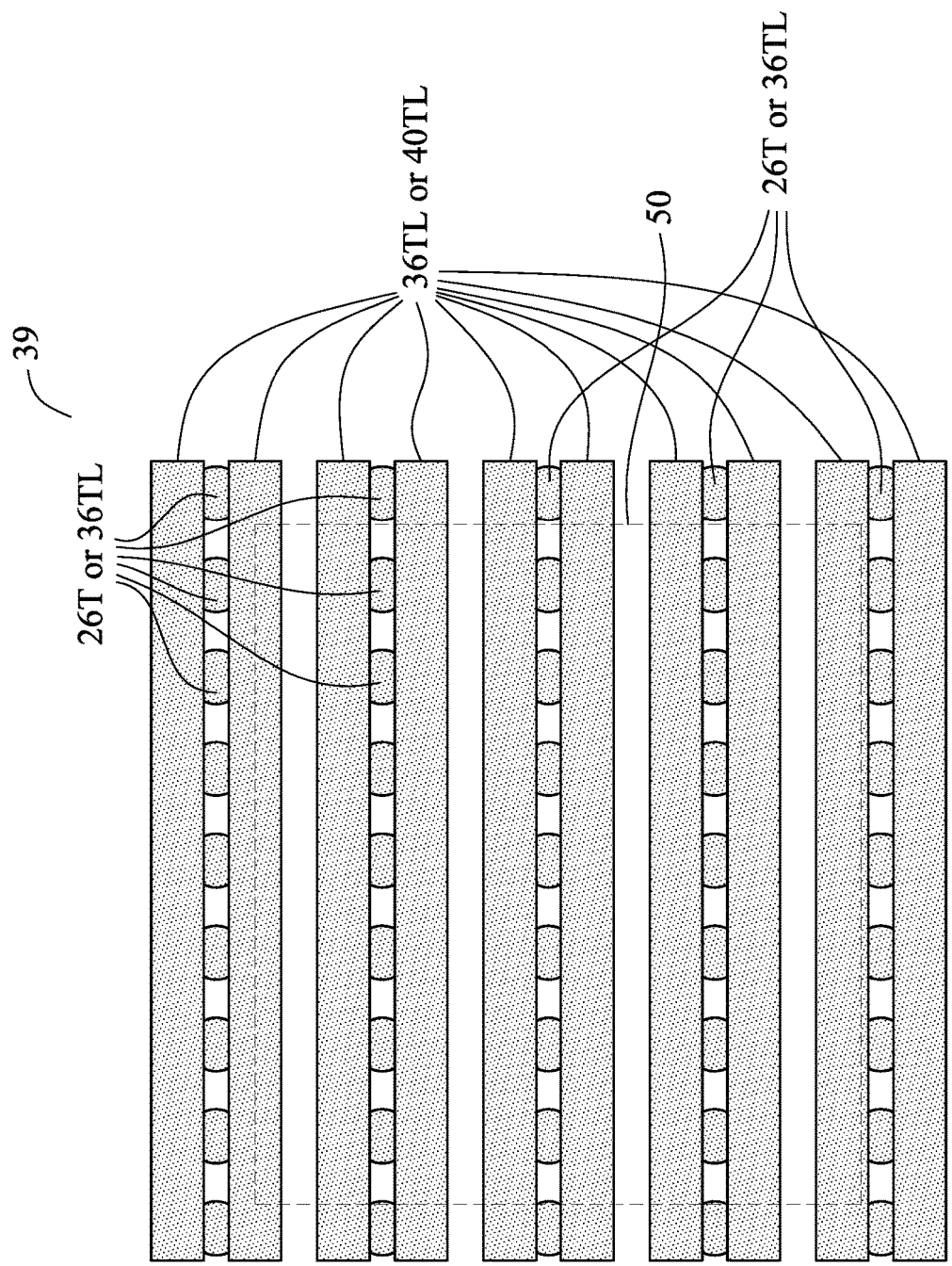

FIG. 25 illustrates that two neighboring thermal dissipation features 26T, 36TL, and 40TL have different shapes. For example, the underlying thermal dissipation features may be 26T or 36TL, and the overlying thermal dissipation features may be 36TL or 40TL, correspondingly. In accordance with some embodiments, the overlying thermal dissipation features 36TL/40TL are illustrated as vertically offset from the underlying thermal dissipation features 26T/36TL. In accordance with alternative embodiments, the overlying thermal dissipation features 36TL/40TL may also be vertically aligned to, and hence fully overlap, the underlying thermal dissipation features 26T/36T. The vias are not shown, while they are formed where overlapping occurs.

Figure 26:
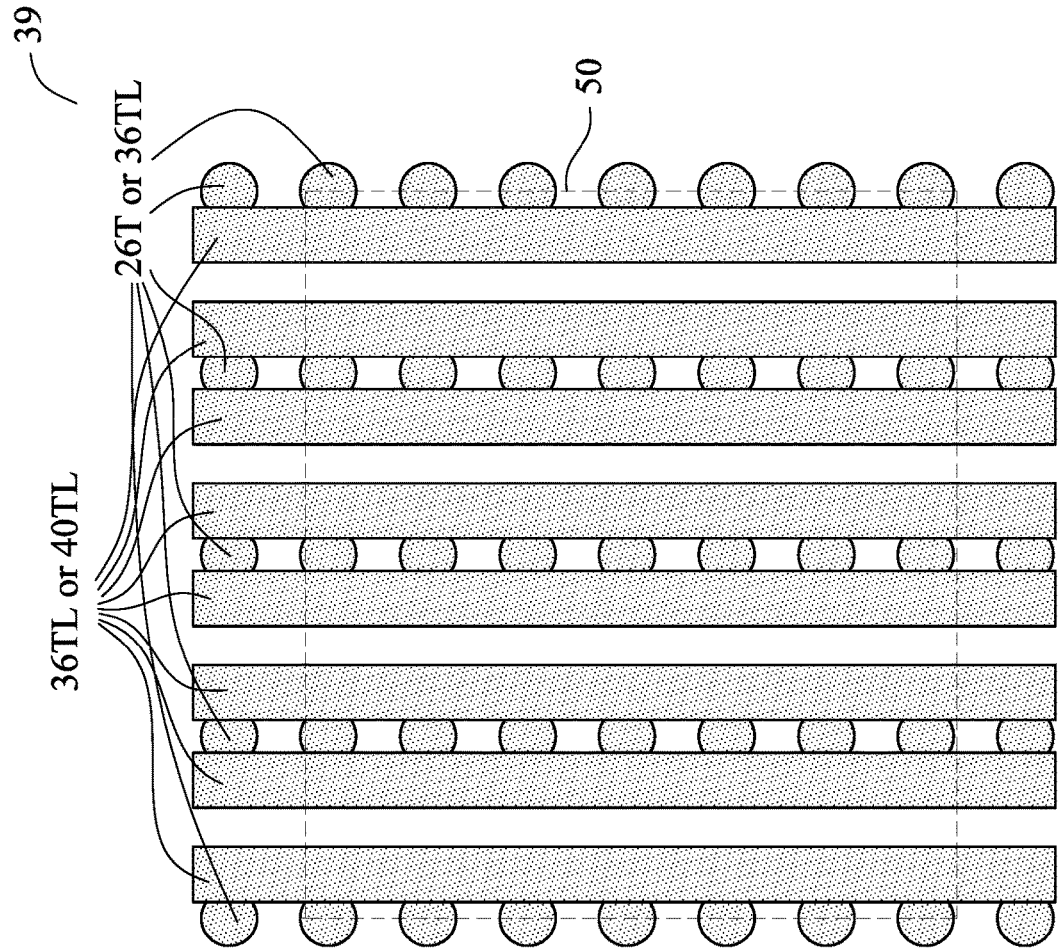

FIG. 26 also illustrates two neighboring thermal dissipation features 26T, 36TL, and 40TL having different shapes. These embodiments differ from FIG. 25 in that some of the underlying thermal dissipation features 26T/36TL may have overlying thermal dissipation features 36T/40TL on only one side, while some other thermal dissipation features 26T/36TL may have overlying thermal dissipation features 36TL/40TL on both sides. In FIG. 25, however, all of dissipating features 26T/36TL may have overlying thermal dissipation features 36TL/40TL on both sides.

Figure 27:
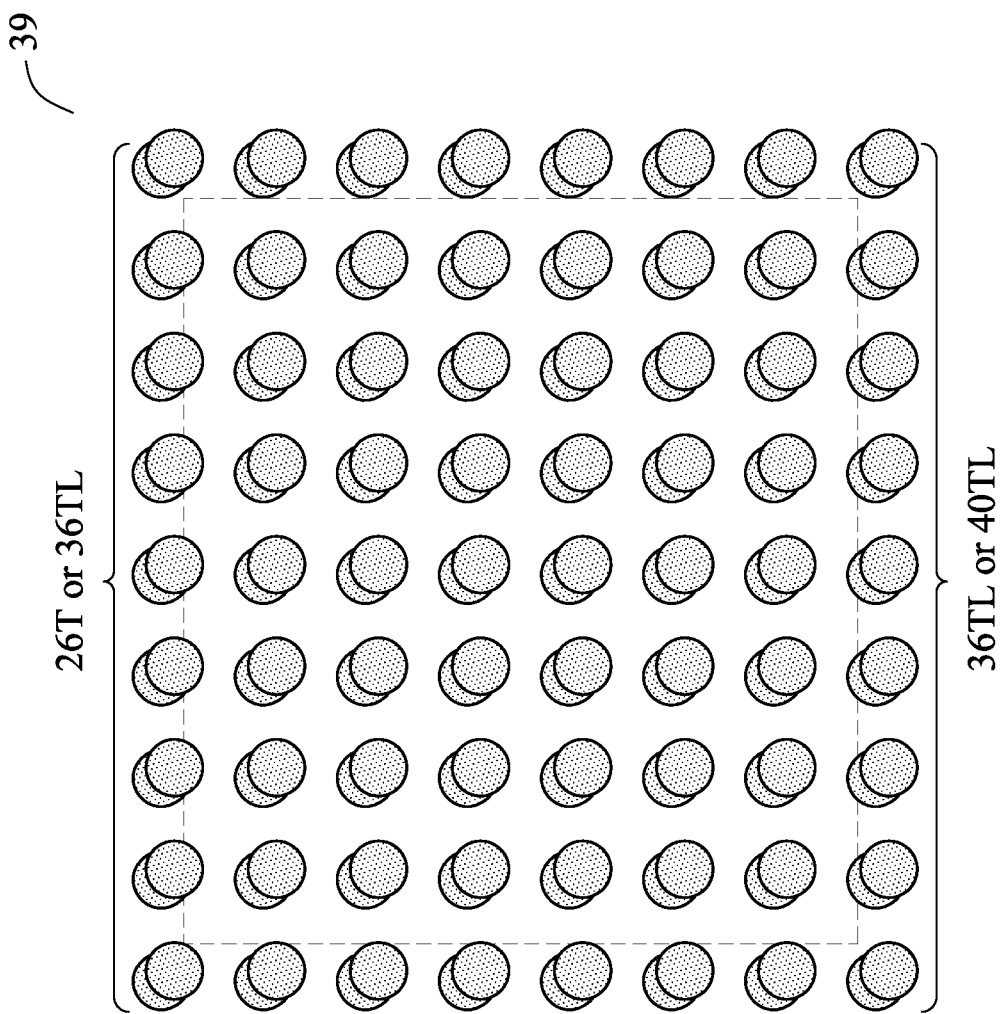

FIG. 27 illustrates that two neighboring layers of thermal dissipation features 26T, 36TL, and 40TL are all discrete pads, which may be arranged as arrays or other repeating patterns such as honeycomb patterns. Although FIG. 27 illustrates thermal dissipating features 26T, 36TL, and 40TL are slightly offset from each other, the overlying thermal dissipation features 36TL/40TL may also fully overlap the underlying thermal dissipation features 26T/36TL. Vias (not shown) connect the overlying thermal dissipation features 36TL/40TL to the underlying thermal dissipation features 26T/36TL.

Figure 28:
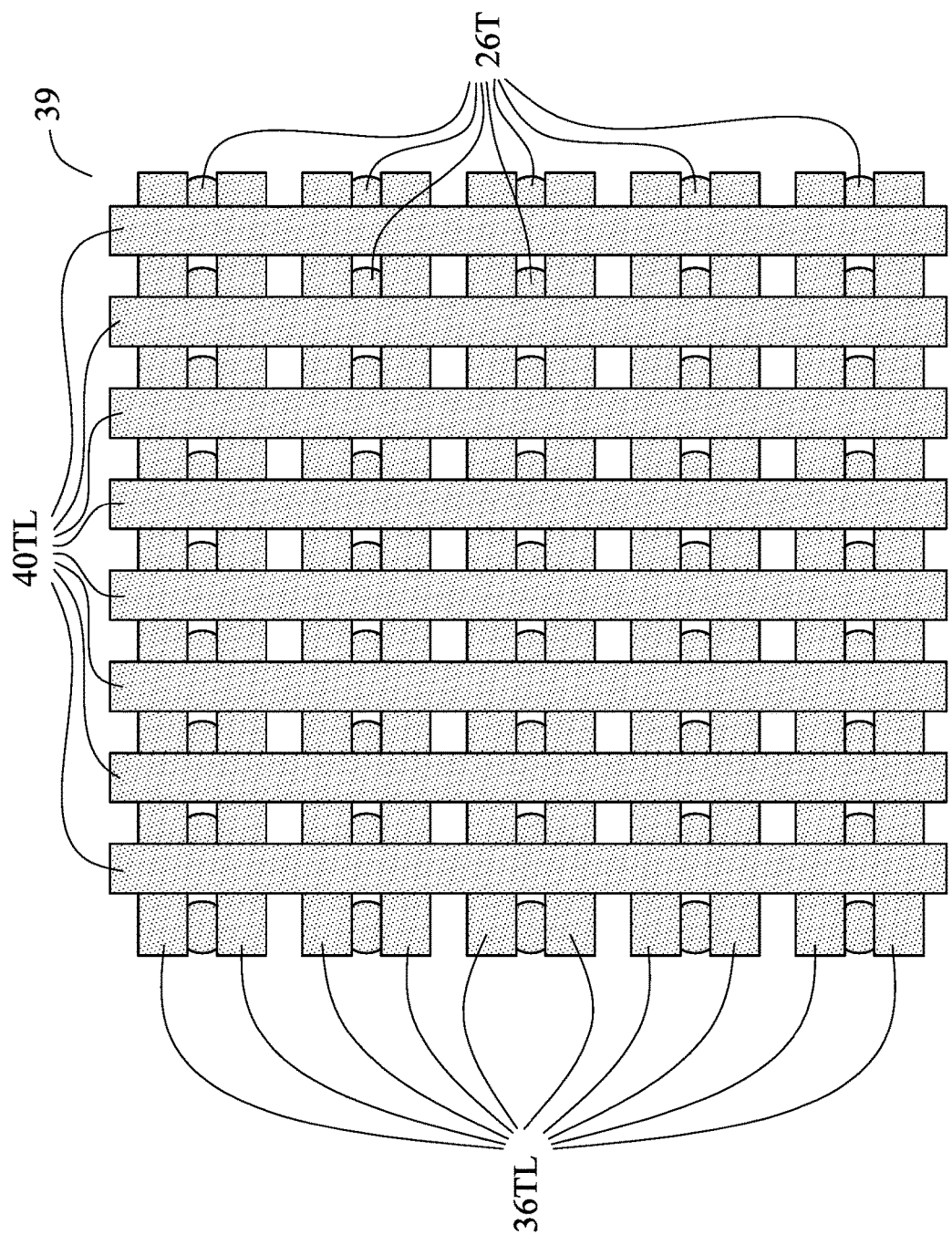
FIGS. 28-29 illustrate the top views of three-layer thermal dissipation blocks in accordance with some embodiments.
Figure 29:
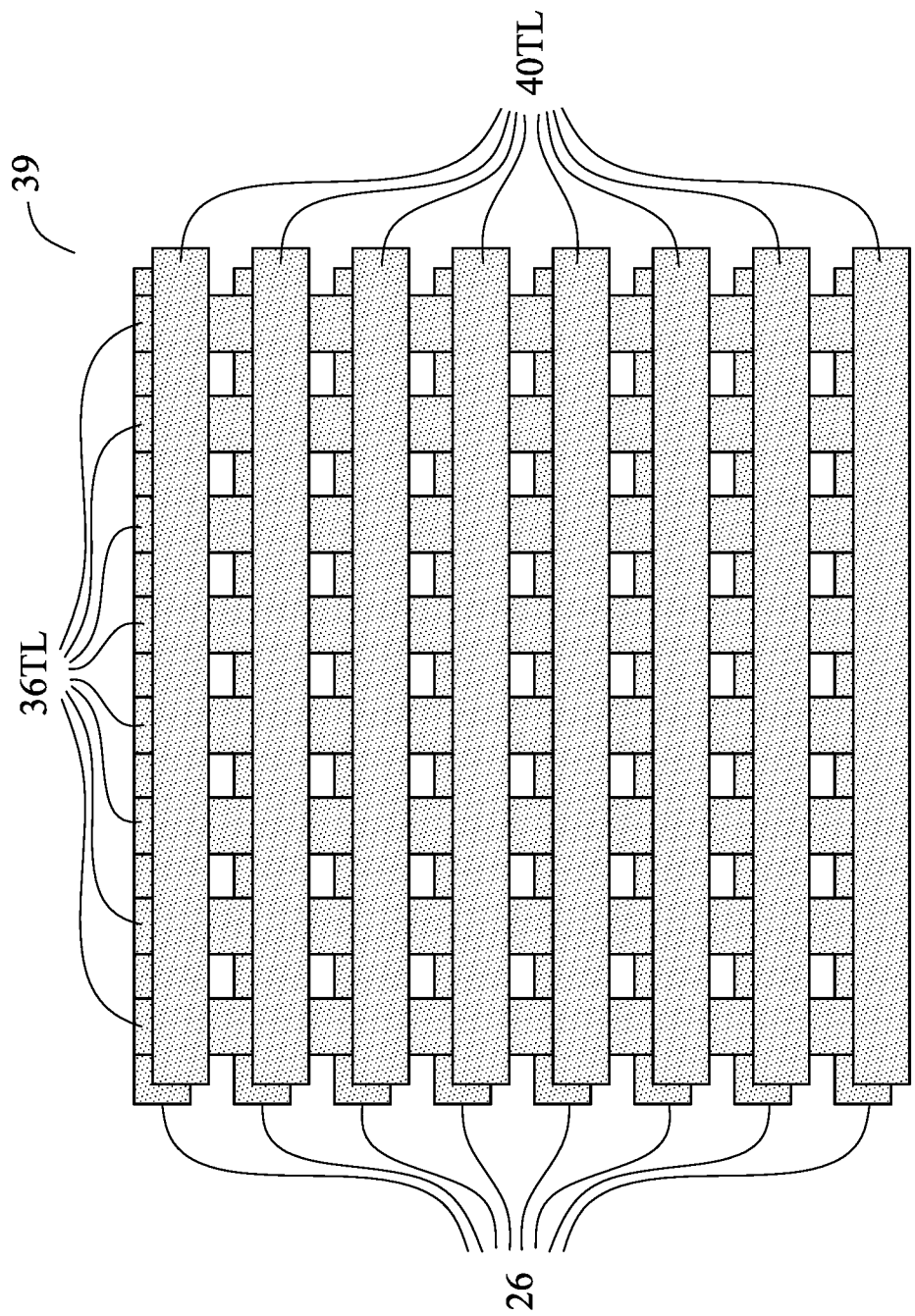

FIG. 28 illustrates that three metal layers of thermal dissipation block 39 have perpendicular metal strips in two metal layers, and may include metal pads forming an array in another metal layer. FIG. 29 illustrates that three metal layers of thermal dissipation block 39 all include parallel metal strips, and the metal strips in neighboring metal layers extend in perpendicular directions.

The above-discussed layouts of thermal dissipation block 39 shown in FIGS. 19 through 29 may also be applied to the front-side thermal dissipation block 75 (FIG. 17), except that since package component 50 needs to have RDLs on the front side to electrically route their connections, the patterns in thermal dissipation block 75 (if formed) are made smaller than in thermal dissipation block in order to allow space for allocating RDLs.

In accordance with some embodiments, since thermal dissipation blocks 39 and 75 (FIG. 17) are formed of metallic materials, thermal dissipation blocks 39 and 75 have higher thermal conductivity values than the dielectric layers in which thermal dissipation blocks 39 and 75 are located. Accordingly, through thermal dissipation blocks 39 and 75, the heat generated by package component 50 may be conducted away more efficiently, for example, in the directions shown by arrows 104 in FIG. 17. Experiment results revealed that by adopting the embodiments of the present disclosure, the temperature of package component 50 may be significantly lowered. For example, a first sample formed without having thermal dissipation block 39 may have its temperature at its back surface as high as 113° C., while when thermal dissipation block 39 is formed, the temperature is reduced to 88° C.

To improve the thermal conductivity of thermal dissipation blocks 39 and 75, the density of the metal in thermal dissipation blocks 39 and 75 may be increased. Throughout the description, metal density refers to the ratio of the total top-view area of metal in a region to the area of the region. The area of the region may be greater than about 500 μm×500 μm. In accordance with some embodiments, the metal density of thermal dissipation block 39 may be calculated as the total area of metal in the portion of thermal dissipation block 39 overlapped by package component 50 divided by the area of package component 50. For example, in the device region in which thermal dissipation block 39 is located, the metal density may be greater than about 10 percent, and may be any value in the range between about 10 percent and 100 percent. As a comparison, in the regions surrounding thermal dissipation block 39, the metal density, which is the metal density of RDLs, may be lower than about 5 percent, and may be in the range between about 2 percent and about 5 percent in order to maintain good electrical performance. Accordingly, the metal density in the region where thermal dissipation block 39 is formed may be 2 times to 50 times the metal density in the surrounding regions, which surrounding regions are used for routing RDLs 26E, 36E, and 40E.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming thermal dissipation blocks with a high metal density, the heat generated by the heat-generating package components can be efficiently conducted away from the package components. The temperature of the respective package components is thus reduced.

In accordance with some embodiments of the present disclosure, a method comprises forming a first package comprising forming a plurality of redistribution lines over a carrier; forming a thermal dissipation block over the carrier, wherein the plurality of redistribution lines and the thermal dissipation block are formed by common processes, wherein the thermal dissipation block has a first metal density, and the plurality of redistribution lines have a second metal density smaller than the first metal density; forming a metal post over the carrier; placing a device die directly over the thermal dissipation block; and encapsulating the device die and the metal post in an encapsulant; and de-bonding the first package from the carrier. In an embodiment, the device die is placed with a backside of the device die facing the thermal dissipation block. In an embodiment, the device die is placed with a front side of the device die facing the thermal dissipation block. In an embodiment, the forming the thermal dissipation block comprises forming a plurality of thermal dissipation features extending into a plurality of layers, wherein portions of the plurality of thermal dissipation features in different layers are electrically interconnected. In an embodiment, the forming the thermal dissipation block comprises forming a first plurality of elongate strips parallel to each other. In an embodiment, in a top view of the thermal dissipation block, one of the first plurality of elongate strips extends beyond opposite edges of the device die. In an embodiment, the forming the thermal dissipation block further comprises forming a second plurality of elongate strips parallel to each other, wherein the second plurality of elongate strips and the first plurality of elongate strips are perpendicular to each other. In an embodiment, the forming the thermal dissipation block comprises forming a plurality of metal pads arranged as a repeating pattern, wherein first portions of the plurality of metal pads in a first layer of the thermal dissipation block are connected to second portions of the plurality of metal pads in a second layer of the thermal dissipation block. In an embodiment, the thermal dissipation block comprises a solid pad, wherein in a top view of the thermal dissipation block, edges of the solid pad laterally extend substantially to corresponding edges of the device die. In an embodiment, the thermal dissipation block is connected to an electrical ground. In an embodiment, the method further comprises bonding a package component to the first package to form a second package, wherein in the second package, the thermal dissipation block is electrically floating.

In accordance with some embodiments of the present disclosure, a package comprises a device die; a plurality of redistribution lines underlying the device die, wherein the plurality of redistribution lines are electrically connected to the device die; a thermal dissipation block underlying the device die, wherein the thermal dissipation block is overlapped by at least a majority of the device die, and wherein in a top view of the package, the thermal dissipation block laterally extends substantially to opposing edges of the device die; and an encapsulant encapsulating the device die therein. In an embodiment, in a top view of the package, the thermal dissipation block laterally extends to opposing edges of the device die. In an embodiment, the thermal dissipation block comprises a plurality of thermal dissipation features distributed in a plurality of layers, and wherein the plurality of thermal dissipation features in the plurality of layers are physically joined as an integrated feature. In an embodiment, no redistribution line is overlapped by the device die and also in same layers as the thermal dissipation block, and no dummy features is overlapped by the device die and also in same layers as the thermal dissipation block. In an embodiment, the thermal dissipation block is electrically grounded. In an embodiment, the thermal dissipation block is electrically floating.

In accordance with some embodiments of the present disclosure, a package comprises a first package component; a second package component over and bonded to the first package component, the second package component comprising: a thermal dissipation block comprising: a first plurality of portions forming a first layer, and a second plurality of portions forming a second layer, wherein in a top view of the package, the first plurality of portions and the second plurality of portions form a mesh; and a plurality of vias joining the first plurality of portions to the second plurality of portions, and electrically interconnecting the first plurality of portions and the second plurality of portions as an integrated piece; a device die overlapping the thermal dissipation block; and a third package component bonding to the second package component. In an embodiment, the thermal dissipation block is electrically grounded. In an embodiment, the package further comprises a plurality of redistribution lines on opposing sides of the thermal dissipation block, wherein the plurality of redistribution lines have a first metal density, and the thermal dissipation block has a second metal density greater than about two times the first metal density.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package comprising:
a device die;
a plurality of redistribution lines overlying the device die, wherein the plurality of redistribution lines are electrically connected to the device die;
a metallic block overlapped by the device die, wherein in a top view of the package, the metallic block comprises a straight edge extending substantially from a first edge to a second edge of the device die, and wherein the first edge and the second edge are first opposing edges of the device die; and
an encapsulant encapsulating the device die therein.

2. The package of claim 1, wherein in the top view of the package, the metallic block further comprises an additional straight edge extending substantially from a third edge to a fourth edge of the device die, and wherein the third edge and the fourth edge are perpendicular to the first edge and the second edge.

3. The package of claim 1, wherein in the top view of the package, the metallic block comprises a first plurality of strips parallel to each other.

4. The package of claim 3, wherein the first plurality of strips are physically separated from each other, and the package further comprises a second plurality of strips parallel to each other, wherein the second plurality of strips are underlying the first plurality of strips, and wherein in the top view, the second plurality of strips are perpendicular to the first plurality of strips.

5. The package of claim 3, wherein the first plurality of strips are physically separated from each other, and the package further comprises a second plurality of strips parallel to each other, and wherein the second plurality of strips are overlapped by the first plurality of strips.

6. The package of claim 3 further comprising a second plurality of strips parallel to each other, wherein the second plurality of strips are joined with the first plurality of strips to form a mesh.

7. The package of claim 1 further comprising a plurality of thermal dissipation features overlapping the device die and distributed in a plurality of layers, wherein the plurality of thermal dissipation features in the plurality of layers are physically joined as an integrated feature.

8. The package of claim 7 further comprising:
a first Under-Bump Metallurgy (UBM) over and electrically connecting to one of the plurality of redistribution lines;
a first solder region over and contacting the first UBM;
a second UBM over and joined to a top one of the plurality of thermal dissipation features; and
an underfill over and contacting an entirety of the second UBM.

9. The package of claim 1 further comprising a solder region joined with the metallic block.

10. The package of claim 9, wherein the solder region is a dummy feature.

11. A package comprising:
a first package component comprising:
a plurality of dielectric layers;
a plurality of redistribution lines in the plurality of dielectric layers;
a thermal dissipation block in the plurality of dielectric layers and comprising:
a first plurality of portions in a first layer of the plurality of dielectric layers;
a second plurality of portions in a second layer of the plurality of dielectric layers; and
a plurality of vias joining the first plurality of portions to the second plurality of portions, and electrically interconnecting the first plurality of portions and the second plurality of portions as an integrated block;

a device die overlapping the thermal dissipation block, wherein the plurality of redistribution lines are located in regions that are on opposing sides of the thermal dissipation block; and a second package component bonding to the first package component, wherein the second package component is electrically connected to the device die.

12. The package of claim 11, wherein the first package component is free from redistribution lines that are inside the thermal dissipation block and are also configured for conducting signals.

13. The package of claim 11, wherein the thermal dissipation block comprises a plurality of meshes at different layers, with the first plurality of portions and the second plurality of portions being parts of the plurality of meshes, and wherein the plurality of redistribution lines are located in the regions that are on the opposing sides of the meshes.

14. The package of claim 13 further comprising dielectric materials filled in the plurality of meshes.

15. The package of claim 11, wherein the thermal dissipation block is electrically grounded.

16. The package of claim 11, wherein the plurality of redistribution lines are in the regions surrounding the thermal dissipation block, wherein the plurality of redistribution lines have a first metal density, and the thermal dissipation block has a second metal density greater than about two times the first metal density.

17. A package comprising:
a plurality of dielectric layers;
a plurality of redistribution lines in the plurality of dielectric layers;
a first thermal dissipation block in the plurality of dielectric layers, wherein the first thermal dissipation block has a first metal density, and the plurality of redistribution lines have a second metal density smaller than the first metal density;
a device die overlapping the first thermal dissipation block; and
an encapsulant encapsulating the device die.

18. The package of claim 17, wherein in a top view of the device die and the first thermal dissipation block, substantially an entirety of the first thermal dissipation block is overlapped by the device die.

19. The package of claim 17 further comprising a second thermal dissipation block overlapping the device die.

20. The package of claim 19, wherein some of the plurality of redistribution lines penetrate through, and are electrically decoupled from, the second thermal dissipation block.

* * * * *